US009407355B1

(12) United States Patent
Lerner

(10) Patent No.: US 9,407,355 B1
(45) Date of Patent: Aug. 2, 2016

(54) OPPORTUNISTIC CONTENT DELIVERY USING DELTA CODING

(71) Applicant: ViaSat Inc., Carlsbad, CA (US)

(72) Inventor: David Lerner, Carlsbad, CA (US)

(73) Assignee: VIASAT INC., Carlsbad, CA (US)

( * ) Notice: Subject to any disclaimer, the term of this patent is extended or adjusted under 35 U.S.C. 154(b) by 359 days.

(21) Appl. No.: 13/657,932

(22) Filed: Oct. 23, 2012

Related U.S. Application Data

(60) Provisional application No. 61/551,271, filed on Oct. 25, 2011.

(51) Int. Cl.
G06F 15/16 (2006.01)
H04B 7/185 (2006.01)
H04L 29/08 (2006.01)
H04L 29/06 (2006.01)

(52) U.S. Cl.
CPC ............ *H04B 7/18595* (2013.01); *H04L 67/10* (2013.01); *H04L 69/04* (2013.01)

(58) Field of Classification Search
CPC ............................. H04L 67/10; H04B 7/18595
USPC ........................... 709/201, 203, 217, 218, 219
See application file for complete search history.

(56) References Cited

U.S. PATENT DOCUMENTS

| 5,408,470 | A | 4/1995 | Rothrock |
| 5,740,367 | A | 4/1998 | Spilo |
| 5,870,754 | A | 2/1999 | Dimitrova et al. |
| 5,905,981 | A | 5/1999 | Lawler |

(Continued)

FOREIGN PATENT DOCUMENTS

| EP | 2536065 A2 | 12/2012 |
| WO | WO-01/61886 A2 | 8/2001 |

(Continued)

OTHER PUBLICATIONS

Frantzeskou et al., "Effective Identification of Source Code Authors Using Byte-Level Information," ICSE '06, May 20-28, 2006, Shanghai, China, ACM 1-59593-085-X/06/0005, XP040040085, pp. 893-896.

(Continued)

*Primary Examiner* — Joseph E Avellino
*Assistant Examiner* — Marshall McLeod
(74) *Attorney, Agent, or Firm* — Marsh Fischmann & Breyfogle LLP; Daniel J. Sherwinter

(57) ABSTRACT

Systems and methods are described for avoiding redundant data transfers using delta coding techniques when reliably and opportunistically communicating data to multiple user systems. According to embodiments, user systems track received block sequences for locally stored content blocks. An intermediate server intercepts content requests between user systems and target hosts, and deterministically chucks and fingerprints content data received in response to those requests. A fingerprint of a received content block is communicated to the requesting user system, and the user system determines based on the fingerprint whether the corresponding content block matches a content block that is already locally stored. If so, the user system returns a set of fingerprints representing a sequence of next content blocks that were previously stored after the matching content block. The intermediate server can then send only those content data blocks that are not already locally stored at the user system according to the returned set of fingerprints.

30 Claims, 5 Drawing Sheets

(56) References Cited

U.S. PATENT DOCUMENTS

| | | | |
|---|---|---|---|
| 6,178,461 B1 | 1/2001 | Chan et al. |
| 6,182,133 B1 | 1/2001 | Horvitz |
| 6,339,787 B1 | 1/2002 | Yohe et al. |
| 6,701,316 B1 | 3/2004 | Li et al. |
| 6,879,808 B1 | 4/2005 | Nations et al. |
| 7,124,305 B2 | 10/2006 | Margolus et al. |
| 7,130,890 B1 | 10/2006 | Kumar et al. |
| 7,340,510 B1 | 3/2008 | Liskov et al. |
| 7,359,956 B2 | 4/2008 | Kanai et al. |
| 7,376,150 B2 | 5/2008 | Vedantham et al. |
| 7,430,331 B2 | 9/2008 | Singh |
| 7,509,667 B1 | 3/2009 | Cook |
| 7,636,767 B2 | 12/2009 | Lev-Ran et al. |
| 7,680,897 B1 | 3/2010 | Carter et al. |
| 7,681,032 B2 | 3/2010 | Peled et al. |
| 7,716,367 B1 | 5/2010 | Leighton et al. |
| 7,778,438 B2 | 8/2010 | Malone |
| 7,814,149 B1 | 10/2010 | Stringham |
| 7,836,177 B2 | 11/2010 | Kasriel et al. |
| 7,917,531 B2 | 3/2011 | Sakurai et al. |
| 7,941,409 B2 | 5/2011 | Mimatsu |
| 7,953,881 B2 | 5/2011 | Vadlakonda et al. |
| 8,010,705 B1 | 8/2011 | Sebastian et al. |
| 8,041,677 B2 | 10/2011 | Sumner et al. |
| 8,055,616 B2 | 11/2011 | Johnston et al. |
| 8,082,228 B2 | 12/2011 | Mu |
| 8,151,004 B1 | 4/2012 | Ufimtsev et al. |
| 8,230,059 B1 | 7/2012 | Santos et al. |
| 8,230,461 B1 | 7/2012 | Ledermann et al. |
| 8,284,773 B1 | 10/2012 | Woleben et al. |
| 8,477,635 B2 | 7/2013 | Sebastian et al. |
| 8,489,672 B2 | 7/2013 | Sebastian et al. |
| 8,489,673 B2 | 7/2013 | Sebastian et al. |
| 8,639,744 B2 | 1/2014 | Sebastian |
| 8,671,223 B1 | 3/2014 | Sebastian et al. |
| 8,775,503 B2 | 7/2014 | Sebastian |
| 8,842,553 B2 | 9/2014 | Sebastian et al. |
| 8,897,302 B2 | 11/2014 | Sebastian |
| 9,172,748 B2 | 10/2015 | Sebastian |
| 9,363,308 B2 | 6/2016 | Sebastian et al. |
| 9,369,516 B2 | 6/2016 | Sebastian et al. |
| 2001/0016836 A1 | 8/2001 | Boccon-Gibod et al. |
| 2001/0043600 A1 | 11/2001 | Chatterjee et al. |
| 2002/0006116 A1 | 1/2002 | Burkhart |
| 2002/0026478 A1 | 2/2002 | Rodgers et al. |
| 2002/0129168 A1 | 9/2002 | Kanai et al. |
| 2002/0154887 A1 | 10/2002 | Lu |
| 2002/0188735 A1 | 12/2002 | Needham et al. |
| 2002/0194473 A1 | 12/2002 | Pope et al. |
| 2003/0018581 A1 | 1/2003 | Bratton et al. |
| 2003/0018878 A1 | 1/2003 | Dorward et al. |
| 2004/0205071 A1 | 10/2004 | Uesugi et al. |
| 2005/0010870 A1 | 1/2005 | Gu et al. |
| 2005/0033747 A1 | 2/2005 | Wittkotter |
| 2005/0131903 A1 | 6/2005 | Margolus et al. |
| 2005/0249231 A1 | 11/2005 | Khan |
| 2006/0064383 A1 | 3/2006 | Marking |
| 2006/0184960 A1 | 8/2006 | Horton et al. |
| 2006/0253444 A1 | 11/2006 | O'Toole et al. |
| 2006/0277257 A1 | 12/2006 | Kromann et al. |
| 2006/0288072 A1 | 12/2006 | Knapp et al. |
| 2007/0033408 A1 | 2/2007 | Morten |
| 2007/0101074 A1 | 5/2007 | Patterson |
| 2007/0111713 A1 | 5/2007 | Silverbrook et al. |
| 2007/0116151 A1 | 5/2007 | Thesling |
| 2007/0133554 A1 | 6/2007 | Ederer et al. |
| 2007/0143484 A1 | 6/2007 | Drouet et al. |
| 2007/0174246 A1 | 7/2007 | Sigurdsson et al. |
| 2007/0220303 A1 | 9/2007 | Kimura et al. |
| 2007/0256021 A1 | 11/2007 | Prager et al. |
| 2007/0288518 A1 | 12/2007 | Crigler et al. |
| 2008/0005086 A1 | 1/2008 | Moore |
| 2008/0016201 A1 | 1/2008 | Thompson |
| 2008/0022135 A1 | 1/2008 | Gaya |
| 2008/0066182 A1 | 3/2008 | Hickmott et al. |
| 2008/0144713 A1 | 6/2008 | Kimmich et al. |
| 2008/0155614 A1 | 6/2008 | Cooper et al. |
| 2008/0175239 A1 | 7/2008 | Sistanizadeh et al. |
| 2008/0205396 A1 | 8/2008 | Dakshinamoorthy et al. |
| 2008/0235391 A1 | 9/2008 | Painter et al. |
| 2008/0235739 A1 | 9/2008 | Coebergh Van Den Braak |
| 2008/0256138 A1 | 10/2008 | Sim-Tang |
| 2008/0263130 A1 | 10/2008 | Michalowitz et al. |
| 2008/0320151 A1 | 12/2008 | McCanne et al. |
| 2009/0037393 A1 | 2/2009 | Fredricksen et al. |
| 2009/0049469 A1 | 2/2009 | Small et al. |
| 2009/0055471 A1 | 2/2009 | Kozat et al. |
| 2009/0055862 A1 | 2/2009 | Knoller et al. |
| 2009/0060086 A1 | 3/2009 | Kimmich et al. |
| 2009/0158318 A1 | 6/2009 | Levy |
| 2009/0168795 A1 | 7/2009 | Segel |
| 2009/0187673 A1 | 7/2009 | Ramjee et al. |
| 2009/0234809 A1 | 9/2009 | Bluger et al. |
| 2009/0265516 A1 | 10/2009 | Prabhu et al. |
| 2009/0271528 A1* | 10/2009 | Gurevich et al. | 709/247 |
| 2009/0313329 A1 | 12/2009 | Agrawal et al. |
| 2009/0327505 A1* | 12/2009 | Rao et al. | 709/230 |
| 2010/0058430 A1 | 3/2010 | Jones et al. |
| 2010/0083322 A1 | 4/2010 | Rouse |
| 2010/0177642 A1* | 7/2010 | Sebastian et al. | 370/248 |
| 2010/0179984 A1 | 7/2010 | Sebastian |
| 2010/0179986 A1 | 7/2010 | Sebastian et al. |
| 2010/0179987 A1 | 7/2010 | Sebastian et al. |
| 2010/0180046 A1 | 7/2010 | Sebastian et al. |
| 2010/0185730 A1* | 7/2010 | Sebastian | 709/204 |
| 2010/0281105 A1 | 11/2010 | Sebastian |
| 2012/0039231 A1 | 2/2012 | Suri et al. |
| 2012/0060121 A1 | 3/2012 | Goldberg et al. |
| 2012/0072933 A1 | 3/2012 | Moore |
| 2012/0184309 A1 | 7/2012 | Cohen |
| 2012/0320916 A1 | 12/2012 | Sebastian |
| 2013/0185387 A1 | 7/2013 | Gero |
| 2013/0282796 A1 | 10/2013 | Sebastian et al. |
| 2013/0282863 A1 | 10/2013 | Sebastian et al. |
| 2014/0029612 A1 | 1/2014 | Sebastian et al. |
| 2014/0040353 A1 | 2/2014 | Sebastian et al. |
| 2015/0026241 A1 | 1/2015 | Sebastian |
| 2015/0032848 A1 | 1/2015 | Sebastian et al. |
| 2015/0036686 A1 | 2/2015 | Sebastian |
| 2015/0127715 A1 | 5/2015 | Dankberg |

FOREIGN PATENT DOCUMENTS

| | | | |
|---|---|---|---|
| WO | WO-01/84777 A2 | 11/2001 |
| WO | WO-02/41527 A1 | 5/2002 |
| WO | WO-2007/051079 A2 | 5/2007 |
| WO | WO-2010/083214 A2 | 7/2010 |
| WO | WO-2010/083248 A2 | 7/2010 |

OTHER PUBLICATIONS

Paul et al., "Distributed caching with centralized control," Computer Communications, vol. 24, Issue 2, Feb. 1, 2001, pp. 256-268.

Selvakumar et al., "Implementation and comparison of distributed caching schemes," Computer Communications, vol. 24, Issues 7-8, Apr. 1, 2001, pp. 677-684.

International Search Report and Written Opinion mailed in International Application No. PCT/US2010/020897 on Aug. 16, 2010, 15 pgs.

International Preliminary Report on Patentability mailed in International Application No. PCT/US2010/020897 on Jul. 19, 2011, 10 pgs.

International Search Report and Written Opinion mailed in International Application No. PCT/US2010/020940 on Sep. 22, 2010, 15 pgs.

International Preliminary Report on Patentability mailed in International Application No. PCT/US2010/020940 on Jul. 19, 2011, 10 pgs.

Non-Final Office Action mailed in U.S. Appl. No. 12/651,909 on Feb. 1, 2012, 22 pgs.

Applicant-Initiated Interview Summary mailed in U.S. Appl. No. 12/651,909 on Apr. 16, 2012, 3 pgs.

Amendment and Response to Non-Final Office Action filed in U.S. Appl. No. 12/651,909 on Apr. 27, 2012, 14 pgs.

(56) References Cited

OTHER PUBLICATIONS

Final Office Action mailed in U.S. Appl. No. 12/651,909 on Jun. 22, 2012, 19 pgs.
Notice of Appeal and Pre-Appeal Brief Request for Review filed in U.S. Appl. No. 12/651,909 on Aug. 21, 2012, 6 pgs.
Notice of Panel Decision from Pre-Appeal Brief Review mailed in U.S. Appl. No. 12/651,909 on Sep. 28, 2012, 2 pgs.
Appeal Brief filed in U.S. Appl. No. 12/651,909 on Nov. 27, 2012, 28 pgs.
Examiner's Answer to Appeal Brief mailed in U.S. Appl. No. 12/651,909 on Jan. 31, 2013, 12 pgs.
Reply Brief filed in U.S. Appl. No. 12/651,909 on Mar. 29, 2013, 3 pgs.
Patent Trial and Appeal Board Docketing Notice mailed in U.S. Appl. No. 12/651,909 on Apr. 17, 2013, Appeal No. 2013-006223, 2 pgs.
Non-Final Office Action mailed in U.S. Appl. No. 13/517,860 on Mar. 25, 2014, 13 pgs.
Applicant-Initiated Interview Summary mailed in U.S. Appl. No. 13/517,860 on Jul. 21, 2014, 3 pgs.
Amendment and Response to Non-Final Office Action filed in U.S. Appl. No. 13/517,860 on Jul. 25, 2014, 13 pgs.
Non-Final Office Action mailed in U.S. Appl. No. 13/908,960 on Dec. 23, 2013, 6 pgs.
Response to Non-Final Office Action filed with Terminal Disclaimer in U.S. Appl. No. 13/908,960 on Mar. 24, 2014, 12 pgs.
Notice of Allowance mailed in U.S. Appl. No. 13/908,960 on Apr. 4, 2014, 7 pgs.
Notice of Allowance mailed in U.S. Appl. No. 13/908,960 on May 9, 2014, 7 pgs.
U.S. Appl. No. 13/919,861, filed Jun. 17, 2013, 98 pgs.
U.S. Appl. No. 13/919,888, filed Jun. 17, 2013, 63 pgs.
U.S. Appl. No. 14/046,781, filed Oct. 4, 2013, 63 pgs.
U.S. Appl. No. 14/070,977, filed Nov. 4, 2013, 38 pgs.
U.S. Appl. No. 14/288,188, filed May 27, 2014, 84 pgs.
U.S. Appl. No. 14/453,479, filed Aug. 6, 2014, 77 pgs.
Final Office Action mailed in U.S. Appl. No. 14/070,977 on Feb. 23, 2016, 28 pgs.
Fonseca et al., BitTorrent Protocol—BTP/1.0, Version 1.0, Revision 1.33, Apr. 2005, DIKU, http://jo[;nas.nitro.dk/bittorrent/bittorrent-rfc.html, 15 pgs.
Decision on Appeal mailed in U.S. Appl. No. 12/651,909 on Jul. 30, 2015, Appeal No. 2013-006223, 20 pgs.
Notice of Allowance mailed in U.S. Appl. No. 12/651,909 on Oct. 15, 2015, 8 pgs.
Non-Final Office Action mailed in U.S. Appl. No. 14/046,781 on Nov. 16, 2015, 29 pgs.
Non-Final Office Action mailed in U.S. Appl. No. 14/070,977 on Oct. 8, 2015, 24 pgs.
Non-Final Office Action mailed in U.S. Appl. No. 14/453,479 on Mar. 13, 2015, 7 pgs.
Notice of Allowance mailed in U.S. Appl. No. 14/453,479 on Sep. 14, 2015, 7 pgs.
Non-Final Office Action mailed in U.S. Appl. No. 14/517,337 on Dec. 31, 2015, 20 pgs.
Extended European Search Report mailed in European Patent Application No. 12171996.7 on Feb. 2, 2015, 8 pgs.
Notice of Allowance mailed in U.S. Appl. No. 14/453,479 on Jan. 21, 2016, 8 pgs.
Notice of Allowance mailed in U.S. Appl. No. 12/651,909 on Feb. 5, 2016, 8 pgs.
Advisory Action mailed in U.S. Appl. No. 14/070,977 on May 5, 2016, 3 pgs.
Final Office Action mailed in U.S. Appl. No. 14/517,337 on May 24, 2016, 22 pgs.

\* cited by examiner

OPPORTUNISTIC CONTENT DELIVERY USING DELTA CODING

FIELD

Embodiments relate generally to communications systems, and, more particularly, to opportunistic content delivery using delta coding techniques.

BACKGROUND

In many cases, it is desirable to deliver streams or files to the requestor while opportunistically multicasting the same information to others on the network who could potentially be interested in this content at a future point in time. Traditional approaches to prepositioning data streams and files via multicast to remote devices typically involve either: a master copy being maintained on an intermediate server so that when the data is later requested from the remote device, missing data elements or forward error correction codes can later be transmitted to fill in the holes; or remote devices requesting missing data as the multicast is being received.

Additionally, traditional approaches to delta coding and the like rely on keeping track of the information stored on both the client and server sides of a network. Typically, this further involves overhead for keeping the delta coders (e.g., dictionaries and the like) synchronized. When delta coding is applied to multicast stream distribution, the network overhead for maintaining coder synchronization can be large. The cost of transmitting delta coder synchronization and forward error correction traffic can impose an especially heavy burden when information is distributed opportunistically if this traffic is sent, whether or not the content is later consumed.

BRIEF SUMMARY

Among other things, systems and methods are described for opportunistically avoiding redundant data transfers to users by using a stateless intermediate server and delta coding techniques. When a user requests content over a communications network, the user can already have a locally stored copy of some or all of the requested content (e.g., because of a previous request for the content, anticipatorily pre-positioned content, etc.). According to embodiments, the user systems track received block sequences for locally stored content blocks. An intermediate server, disposed in the communications network between the requesting user system and the target host system, deterministically chucks the content data as it is intercepted from the host in response to user requests, and generates fingerprints (e.g., checksums) of the content chunks. Fingerprints of one or more content blocks are communicated to at least the requesting user (e.g., by unicast or multicast) in advance of sending the actual content blocks. The user system can compare the fingerprint received from the intermediate server with fingerprints of locally stored blocks. When a match is detected, the user system returns a set of fingerprints representing the next content blocks that were previously stored after the matching content block in sequence. The intermediate server can use those received fingerprints to determine which of the next content blocks in the sequence are already locally stored at the user system, and can send only those content blocks that are missing from the user system's local storage. The user system can then use a combination of locally stored and newly received content blocks to fulfill the request for the content data.

According to one set of embodiments, a method is provided for communicating content data from a server optimizer to client optimizers over a communications network. The method includes: determining, by the server optimizer, to communicate content data to a client optimizer; chunking the content data into a first content block and a set of subsequent content blocks; computing server fingerprints of each of the first content block and the set of subsequent content blocks; communicating a first fingerprint corresponding to the first content block from the server optimizer to the client optimizer; receiving a response package at the server optimizer from the client optimizer, the response package comprising a set of client fingerprints, each associated with a locally stored content block that was received and stored by the client optimizer after prior receipt of a matching content block, the matching content block being equivalent to the first content block according to their respective client and server fingerprints; determining, for each of the set of subsequent content blocks, whether the corresponding server fingerprint indicates equivalence to one of the locally stored content blocks according to its respective client fingerprint received as part of the response package; and communicating a subset of the set of subsequent content blocks from the server optimizer to the client optimizer according to the determination by the server optimizer to communicate the content data to the client optimizer, such that the corresponding server fingerprint of each communicated subsequent content block indicates no equivalence to one of the locally stored content blocks according to its respective client fingerprint.

According to another set of embodiments, a server-side system is disposed in a communications network between client optimizers and content servers. The server-side system handles communication of content data from the content servers to the client optimizers over the communications network. The server-side system includes an object processing subsystem and a communications subsystem. The object processing subsystem is operable to: chunk content data into a first content block and a set of subsequent content blocks; and compute server fingerprints of each of the first content block and the set of subsequent content blocks. The communications subsystem is in communication with the object processing subsystem and is operable to: communicate a first fingerprint corresponding to the first content block from the server optimizer to a client optimizer; receive a response package at the server optimizer from the client optimizer, the response package comprising a set of client fingerprints, each associated with a locally stored content block that was received and stored by the client optimizer after prior receipt of a matching content block, the matching content block being equivalent to the first content block according to their respective client and server fingerprints; determine, for each of the set of subsequent content blocks, whether the corresponding server fingerprint indicates equivalence to one of the locally stored content blocks according to its respective client fingerprint received as part of the response package; and communicate a subset of the set of subsequent content blocks from the server optimizer to the client optimizer, such that the corresponding server fingerprint of each communicated subsequent content block indicates no equivalence to one of the locally stored content blocks according to its respective client fingerprint.

According to another set of embodiments, a system is provided for opportunistically handling content data delivery from a server optimizer to a number of client optimizers over a communications network. The system includes a server optimizer operable to: select a first set of client optimizers of the plurality of client optimizers for reliable delivery of content data, the plurality of client optimizers in communication with the server optimizer over a shared communications link in such a way that, when the content data is reliably received by the first set of client optimizers over the shared communications link, others of the plurality of client optimizers opportunistically receive the content data over the shared communications link; multicast a set of fingerprints corresponding to the content data over the shared communications link; receive a response package at the server optimizer from each of the first set of client optimizers, each response package indicating any portions of the content data presently stored local to the respective client optimizer according to at least one of the received set of fingerprints; determine a missing portion of the content data according to the portions of the content data not presently stored local to the first set of client optimizers as indicated by their respective response packages; and multicast the missing portion of the content data over the shared communications link according to the determination. In some such embodiments, the system further includes client optimizers, each in communication with the server optimizer over the shared communications link. Each client optimizer is operable to: receive a fingerprint from the server optimizer corresponding to a portion of content data; determine whether the corresponding portion of the content data matches locally stored content data according to the fingerprint; generate the response package indicating any portions of the content data presently stored local to the client optimizer when the corresponding portion of the content data matches locally stored content data according to the fingerprint; and store the corresponding portion of the content data when subsequently received by the client optimizer when the corresponding portion of the content data does not match locally stored content data according to the fingerprint.

According to another set of embodiments, another method is provided for handling content communications between a server optimizer and a plurality of client optimizers over a communications network. The method includes: receiving, by a client optimizer from the server optimizer, a first server fingerprint corresponding to a first content block, the first content block being one of a plurality of content blocks generated by the server optimizer from content data; determining, by the client optimizer, whether a first locally stored content block matches the first content block by comparing the first server fingerprint to a client fingerprint of the first locally stored content block, the first locally stored content block having been received and stored by the client optimizer prior to receiving the first server fingerprint from the server optimizer; and when the locally stored content block matches the first content block: generating a response package by the client optimizer, the response package comprising a set of client fingerprints, each associated with a locally stored content block that was received and stored by the client optimizer directly after receipt of the first locally stored content block; and communicating the response package from the client optimizer to the server optimizer in response to receiving the first server fingerprint.

According to another set of embodiments, a client-side system is provided for receiving content data from content servers over a communications network via a server optimizer. The client-side system includes an object processing subsystem and a communications subsystem. The object processing subsystem is operable to: determine whether a first locally stored content block matches a first content block by comparing a first server fingerprint to a client fingerprint of the first locally stored content block, the first server fingerprint corresponding to a first content block being one of a plurality of content blocks generated by the server optimizer from content data, the first locally stored content block having been received and stored by the client optimizer prior to receiving the first server fingerprint from the server optimizer; and generate a response package by the client optimizer when the locally stored content block matches the first content block, the response package comprising a set of client fingerprints, each associated with a locally stored content block that was received and stored by the client optimizer directly after receipt of the first locally stored content block. The communications subsystem is in communication with the object processing subsystem and is operable to communicate the response package from the client optimizer to the server optimizer in response to receiving the first server fingerprint.

BRIEF DESCRIPTION OF THE DRAWINGS

The present disclosure is described in conjunction with the appended figures.

Figure 1:
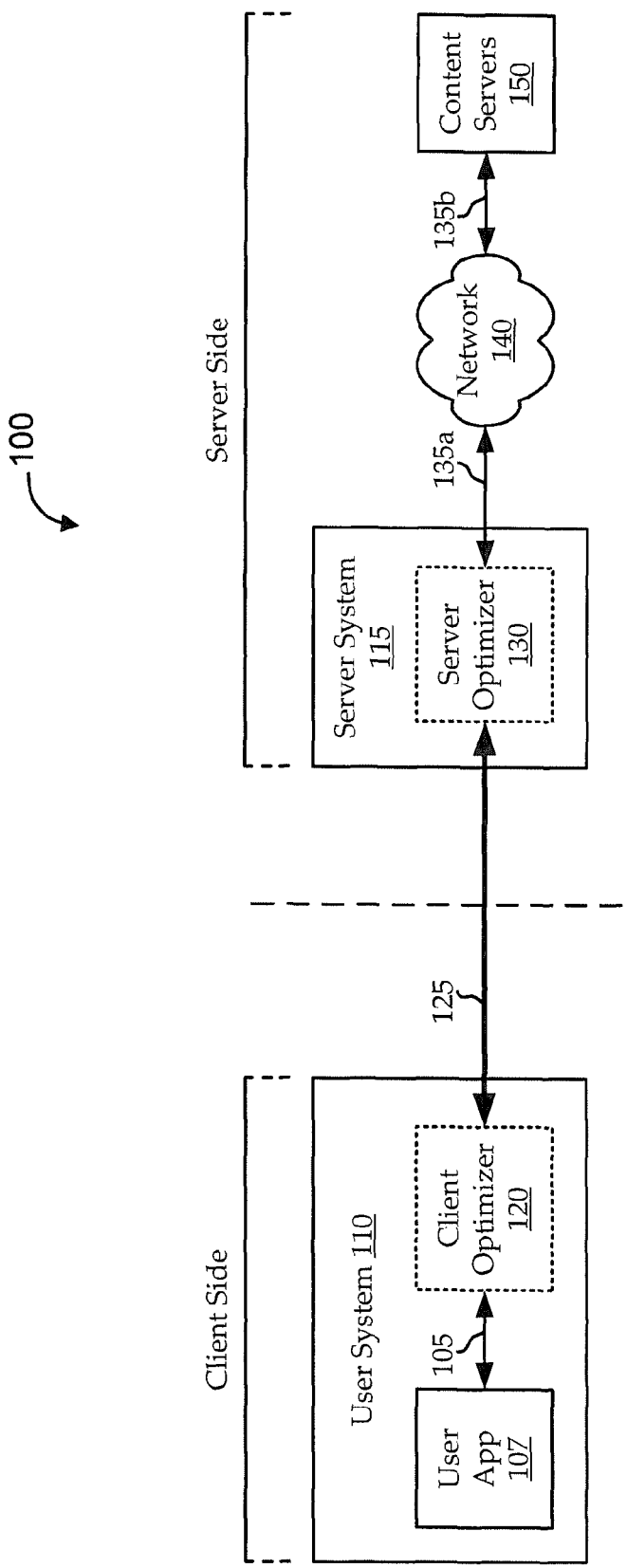
FIG. 1 shows a simplified block diagram of one embodiment of a communications system for use with various embodiments.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION

Communications networks have limited resources, yet it can still be desirable to maximize the ability of users of those resources to communicate (e.g., send and/or receive) content over those resources. Some approaches involve prepositioning content data at local storage devices of user systems. When users request content, the system can determine whether the users previously received and stored the content, and, if so, can locally satisfy at least some of the request without re-sending the data. Traditional approaches to determining whether the users previously received and stored the content typically involve maintaining master copies of content on an intermediate server, waiting for remote devices (e.g., user systems) to request particular missing data, or keeping track of the information stored on both the client and server sides of a network. These traditional approaches can result in large amounts of overhead, for example, in maintaining and communicating synchronization and error correction information between client and server storage models (e.g., delta coders, dictionaries, forward error correction, and the like).

Some embodiments described herein include techniques for exploiting a tendency of long sequences of a data stream to be received in the same order when ultimately requested as they would have been previously received if opportunistically prepositioned. One set of embodiments includes a method for prepositioning data to delta coders using block checksums (e.g., or other types of fingerprints or the like). According to such embodiments, a stream of data is deterministically chunked into blocks by an intermediate server (e.g., a proxy server) and multicast to multiple remote devices. For example, each block can be a byte sequence, a file, a set of files, etc. A checksum for the block of data is generated by the intermediate server, and the checksum is multicast to a set of remote devices (e.g., acting as proxy clients). One or more remote devices receive the checksum, which are used to determine whether the block has previously been received and stored. One or more remote devices can store the checksum, while keeping track of the order in which the checksums are received. The block of data is multicast by the intermediate server after the checksum, which one or more remote devices will store if the checksum was stored.

When the end user of the remote device makes a request for content, the intermediate server can communicate (e.g., multicast or unicast) the checksum for each block in response to the request. If the remote device that made the request has the checksum in its store, it looks up the checksums of the blocks that were associated with the stream in which this block was previously observed (e.g., other pieces of the data that arrived not too long after the arrival of this block) and sends the set of checksums to the server. Meanwhile, if the intermediate server has not received information from the remote device that requested the stream indicating that the data block has been previously received, the block is transmitted. The intermediate server compares the remote device's checksums to the checksums associated with the incoming stream and when there is a match, informs the remote device of the match and does not transmit the data block.

Embodiments can be used to avoid certain limitations of traditional techniques for multicasting and delta coding. For example, embodiments mitigate saving of content on an intermediate server and keeping track on the immediate server of which data has been stored on which remote devices. Embodiments can further avoid affiliating each remote device with a single intermediate server and can substantially reduce network overheads associated with ensuring reliable distribution to remote devices, whether or not those devices consume the data stream at some point in the future. Various implementations of embodiments also allow deployment at any point in the stream download. For example, a remote device can be missing the first n blocks, but can detect a checksum match on the next block (e.g., "Block N"). Some or all of the remaining blocks (subsequent to Block N) can then be communicated with delta compression.

Various embodiments include and/or provide additional features. According to one embodiment, the first block of data is buffered by the intermediate server until the remote device indicates whether the data is in the data store. If the first block had been previously transmitted and stored by the remote device, it would not need to be resent. According to another embodiment, if some of the blocks were previously received with errors or holes, the remote device can respond with the checksum match plus the list of missing packets. Alternatively, if the blocks were initially sent with large block forward error correcting codes (e.g., Low Parity Density Check codes), the remote device can respond with an indication of the amount of error loss that was incurred. The intermediate server could then send only the missing packets or additional error correction codes that are needed to fill the holes. According to yet another embodiment, the checksum and hole data is only uploaded at the rate that the remote device is consuming the input data. Rather than uploading all checksums and holes associated with a stream when a block match occurs, only checksums and holes associated with the next blocks that are expected to be transmitted are uploaded. According to still another embodiment, when a user of a remote device requests a stream, this stream can be converted to multicast by the intermediate server, and distributed opportunistically to multiple devices. Reliable transport would be assured to the requesting remote devices while other devices passively listen and opportunistically store the data. The decision as to which content to opportunistically store can be described via an end-user profile. Based on the profile, the remote device can discard data that is less likely to be consumed and store content that is more likely to be consumed.

In the following description, numerous specific details are set forth to provide a thorough understanding of various embodiments. However, one having ordinary skill in the art should recognize that the invention can be practiced without these specific details. In some instances, circuits, structures, and techniques have not been shown in detail to avoid obscuring the present invention. Further, terms such as "optimize" or "maximize" are intended to connote a relative or desired outcome, rather than an absolute outcome, and should not be considered as limiting potential embodiments. For example, embodiments described with reference to optimization are intended to include even variations deemed to be sub-optimal. Further, a number of "opportunistic" techniques are described herein, and are intended broadly to include techniques for dynamically optimizing infrastructure resources based on present usage of those resources, for example, using opportunistic time shifting and/or opportunistic delay shifting techniques.

Turning first to FIG. 1, a simplified block diagram is shown of one embodiment of a communications system 100 for use with various embodiments. The communications system 100 facilitates communications between a user system 110 and a content server 150 via a client optimizer 120, a server optimizer 130, and a network 140. The client optimizer 120 and the server optimizer 130 can be configured to effectively provide transparent optimization (e.g., acceleration) functionality to a user application 107 running on the user system 110. The user application 107 can be a web browser, browser plug-in or extension, media player, or any other client-side application that can benefit from the optimization functionality of the client optimizer 120 and server optimizer 130. As illustrated, the client optimizer 120 and the user application 107 are in communication over a local link 105 (e.g., a physical or logical unicast communications link), the client optimizer 120 and the server optimizer 130 are in communication over a client-server communication link 125 (e.g., one or more physical and/or logical unicast and/or multicast communications links), and the server optimizer 130 is in communication with the content server 150 over a content network link 135 (e.g., one or more physical and/or logical unicast communications links).

As described more fully below, functionality of various embodiments exploits multicasting (e.g., opportunistic multicasting) over the client-server communication link 125, while preserving transparency to the user system 110. For the sake of illustration, a user requests to view a video stream through a web browser (i.e., user application 107) running on a local terminal (i.e., user system 110). The request is issued as a unicast communication to a particular content server 150 (e.g., as a "GET" command), and the user application 107 expects to receive a unicast communication in response to that request. In certain embodiments, the request is forwarded by the client optimizer 120 to the server optimizer 130 over the client-server communication link 125 as a unicast communication. The server optimizer 130 issues the request to the content server 150 as a proxy for the user system 110 and begins receiving the stream data in response to the request. The server optimizer 130 determines which data should be opportunistically multicast to multiple user systems 110, and communicates that data as multicast traffic over the client-server communication link 125 to the client optimizer 120 (e.g., and to other client optimizers (not shown) configured to receive the multicast traffic). The client optimizer 120 can then convert the traffic to a unicast stream and communicate the unicast stream over the local link 105 to the user application 107. In this way, the user application 107 sees the response as the expected unicast communication of the stream content in response to its request, while allowing the server optimizer 130 to transparently perform optimization functionality (e.g., including opportunistic multicasting). This and other embodiments, and related functionality, are described more fully below.

Embodiments of the optimizer (e.g., the server optimizer 130 and the client optimizer 120) can be implemented in a number of ways without departing from the scope of the invention. In some embodiments, the optimizer is implemented as a proxy, such that the server optimizer 130 is a proxy server and the client optimizer 120 is a proxy client. For example, a transparent intercept proxy can be used to intercept traffic in a way that is substantially transparent to users at the client-side of the proxy communication. In other embodiments, the optimizer is implemented as an in-line optimizer. For example, the client optimizer 120 is implemented within a user terminal and the server optimizer 130 is implemented within a provider terminal (e.g., a satellite base station or gateway, a cable head-end, a digital subscriber line access multiplexer (DSLAM), etc.). Other configurations are possible in other embodiments. For example, embodiments of the server optimizer 130 are implemented in the Internet cloud (e.g., on commercial network leased server space). Embodiments of the client optimizer 120 are implemented within a user's personal computer, within a user's modem, in a physically separate component at the customer premises, etc. It will be appreciated that the local link 105 can also be implemented in various ways depending on the implementation of the client optimizer 120. For example, an implementation having the client optimizer 120 disposed in a client modem that is physically distinct from a client terminal on which the user application 107 is running can implement the local link 107 as a series of physical and logical links (e.g., wires, ports, etc.); while an implementation having the client optimizer 120 disposed as a software client running on the same client terminal as the user application 107 can implement the local link 107 as a logical link between the applications.

It is worth noting that references herein to "intercepting" data should be construed broadly to include any useful slowing, sampling, re-routing, and/or other techniques that allow processing of the data as required according to various embodiments. In some embodiments, traffic passes through the server optimizer 130, where it is "intercepted" by being buffered for analysis and processing. For example, the buffering can be used to slow and accumulate traffic for fingerprint generation and analysis, as described more fully below. Notably, certain embodiments described as using an optimizer component (e.g., the server optimizer 130) to intercept the traffic can actually be implemented by having a different component intercept the traffic, from which the optimizer component can receive the intercepted traffic for processing.

Embodiments of the user system 110 can include any component or components for providing a user with network interactivity. For example, the user system 110 can include any type of computational device, network interface device, communications device, or other device for communicating data to and from the user. Typically, the communications system 100 facilitates communications between multiple user systems 110 and a variety of content servers 150 over one or more networks 140 (only one of each is shown in FIG. 1 for the sake of clarity). The content servers 150 are in communication with the server optimizer 130 via one or more networks 140. The network 140 can be any type of network 140 and can include, for example, the Internet, an Internet protocol ("IP") network, an intranet, a wide-area network ("WAN"), a local-area network ("LAN"), a virtual private network ("VPN"), the Public Switched Telephone Network ("PSTN"), and/or any other type of network 140 supporting data communication between devices described herein, in different embodiments. The network 140 can also include both wired and wireless connections, including optical links.

As used herein, "content servers" is intended broadly to include any source of content in which the users are potentially interested. For example, a content server 150 can provide website content, television content, movie or audio content, file sharing, multimedia serving, and/or any other useful content. It is worth noting that, in some embodiments, the content servers 150 are in direct communication with the server optimizer 130 (e.g., not through the network 140). For example, the server optimizer 130 can be located in a gateway that includes a content or application server. As such, discussions of embodiments herein with respect to communications with content servers 150 over the network 140 are intended only to be illustrative, and should not be construed as limiting.

In some embodiments, when the user system 110 communicates with the content server 150, the server optimizer 130 intercepts the communications for one or more purposes. As described below, the server optimizer 130 can be part of a server system 115 that includes components for server-side communications (e.g., base stations, gateways, satellite modem termination systems (SMTSs), digital subscriber line access multiplexers (DSLAMs), etc.). In some alternative embodiments, the server optimizer 130 is not implemented (e.g., physically or location-wise) as part of the server system 115, though it can be considered as part of the server system 115 for the sake of clarity. In one embodiment, the server optimizer 130 is implemented by a server in communication with the server system 115 over the network 140. For example, a third party can lease server space that is accessible over the Internet or a private connection (e.g., a high-speed fiber connection). The leased server space can be used for serving the server optimizer 130.

The server optimizer 130 can act as a transparent and/or intercepting proxy. For example, as described above, the client optimizer 120 is in communication with the server optimizer 130 over the client-server communication link 125, and the server optimizer 130 is in communication with the content server 150 over the content network link 135. The server optimizer 130 can act as a transparent man-in-the-middle to intercept upstream and/or downstream data as it passes between the client-server communication link 125 and the content network link 135. Certain embodiments of the server optimizer 130 implement functionality of AcceleNet applications from ViaSat, Inc. Some purposes of the interception can include filtering, caching, parsing, and/or otherwise processing the requests and responses. For example, when the user system 110 requests a web object from a content server 150, the server optimizer 130 can intercept and parse the request to implement prefetching, opportunistic multicasting, and/or other types of functionality.

It will be appreciated that the network configuration illustrated in FIG. 1 is intended to be illustrative only, and other network configurations are possible without departing from the scope of various embodiments. For example, the user system 110 and the server system 115 can each include both client and server functionality (e.g., each can include both a client optimizer 120 and a server optimizer 130). Indeed, embodiments are implemented as a network device having both client optimizer 120 and server optimizer 130 functions, which can be deployed in various locations of a network. The illustrated communications system 100 can be considered, therefore, as either the actual network architecture or as a view of the network architecture from the perspective of a particular transaction or relationship. For example, the communications system 100 can be considered as illustrating a particular opportunistic multicasting relationship, in which the user system 110 is manifesting its client functionality through its client optimizer 120, and the server system 115 is manifesting its server functionality through its server optimizer 130; though each can play a different role in a different transaction or relationship. Further, the client-server communication link 125 can be a link or set of links that are part of a larger network structure (e.g., a mesh network, peer-to-peer network, public Internet, etc. For example, in the illustrative opportunistic multicasting relationship, a particular set of communications links in a network manifest client-server communication link 125 functionality (e.g., a persistent link) for the purpose of the relationship.

It is worth noting that embodiments of the user system 110 and/or the server system 115 can be implemented, in whole or in part, in hardware. Thus, they can include one or more Application Specific Integrated Circuits (ASICs) adapted to perform a subset of the applicable functions in hardware. Alternatively, the functions can be performed by one or more other processing units (or cores), on one or more integrated circuits (ICs). In other embodiments, other types of integrated circuits can be used (e.g., Structured/Platform ASICs, Field Programmable Gate Arrays (FPGAs), and other Semi-Custom ICs), which can be programmed Each can also be implemented, in whole or in part, with instructions embodied in a computer-readable medium, formatted to be executed by one or more general or application specific controllers.

As described more fully below, embodiments of the server optimizer 130 use various techniques (e.g., dictionary coding) to identify redundancies between incoming data and data previously sent across the links of the communication system 100 (e.g., the client-server communication link 125 and the content network link 135). In particular, various techniques (e.g. delta coding, wide dictionary coding, etc.) can allow identification of redundancies in byte sequences traversing the links. These techniques can be used to identify and exploit opportunities for multicasting to increase utilization of the communications links. Use of these techniques to identify and exploit these multicast opportunities is referred to herein as "deltacasting."

It will be appreciated that "delta coding," "dictionary coding," "dictionary," "deltacasting," and other similar terms and phrases are intended to be broadly construed to include use of any type of dictionary-like structure for optimization. Embodiments of the dictionary include chunks of content data (e.g., implemented as delta dictionaries, wide dictionaries, byte caches, object caches, files, file systems, and/or other types of dictionary structures). While traditional delta coding techniques involve having both client-side and server-side dictionaries, embodiments described herein can be implemented with only a client-side dictionary. This can provide certain features, such as limiting the amount of storage needed at the server-side, allowing the client to connect to a different server without appreciably impacting compression functionality, etc. When content data is stored in the dictionary (e.g., the client dictionary), some or all of the blocks of data defining the content can be stored in the dictionary in an unordered, but indexed way. In such implementations, content is not directly accessible from the dictionary; rather, the set of indexes are needed to recreate the content from the set of unordered blocks. As described more fully below, the client can further store fingerprints of previously received content blocks, the order in which blocks were received, and/or other information (e.g., error correction codes, user preferences, etc.).

It is worth noting that data can be communicated over a communications system 100 using one or more protocols that define, among other things, the format for the datagrams (e.g., packets, frames, etc.). Each datagram can typically include a header portion and a content portion. As used herein, the term "header" is intended broadly to include any portions of the datagram other than those used to communicate the actual content (e.g., file data), and is not intended to be limited to any particular datagram format. For example, an Internet protocol (IP) packet can include a header at the beginning of each packet, while other types of datagrams can provide header-types of information in other ways (e.g., using preambles, post-ambles, mid-ambles, spread-ambles, sub-frames, separate signaling or control data, etc.). These header portions can include information, such as source address, destination address, priority, packet length, coding information, modulation information, etc. Of course, those of skill in the art will appreciate that similar categories of header-portion and content-portion information can be found within datagrams of other protocol formats (e.g., HTTP, FTP, etc.).

Much can be gleaned from the header portions of data. For example, the header portion can include metadata or other information about the content portion that can be used to help characterize the content portion of the data. For example, as discussed below, embodiments determine whether requested content includes a content stream (e.g., streaming media). Some techniques for determining whether the requested content includes a content stream include parsing or otherwise analyzing the header portions of data packets to identify a content stream. Other techniques can include, for example, analyzing the requested URL or requested file type to determine if it is likely to correspond to a content stream, or consulting a database of previously identified content streams or content stream candidates.

Embodiments of the server optimizer 130 generate fingerprints (e.g., fingerprints, digests, signatures, hash functions, etc.) from the content portion of the data traversing the communication links. The server optimizer 130 intercepts and analyzes the byte-level data of the content portion in a way that is substantially transparent to the user. Embodiments of the fingerprints are generated so as to be useful in providing functionality described more fully below. For example, hashing functions are applied to traffic, after being intercepted by the server optimizer 130, for use as identifiers (e.g., "weak" identifiers) that are at least strong enough to identify candidate matches between blocks downloaded by the server optimizer 130 in response to a request and blocks previously stored at the client optimizer 120. Some embodiments of the fingerprints are generated so as to be useful further as strong identifiers for representing substantially identical matching blocks.

According to some embodiments, the server optimizer 130 is configured to prepare downloaded data into blocks by deterministic chunking. As used herein, "deterministic chunking" broadly includes any technique for generating a block of data in a deterministic enough way to be useful in regenerating comparable fingerprints. For example, data is downloaded and chunked into Block A and Block B, and fingerprints are generated for Block A and Block B. Later, the same data is downloaded again and chunked again into Block C and Block D. Embodiments use deterministic chunking techniques to ensure with substantial certainty (i.e., a very small error rate) that fingerprints generated for Block A and Block B upon the first download are substantially equivalent to fingerprints generated for Block C and Block D upon the second download, respectively. In one embodiment, the deterministic chunking includes identifying a particular bit stream at which to start a block in such a way that is highly repeatable.

It is worth noting that embodiments of the client-server communication link 125 (e.g., between the client optimizer 120 and the server optimizer 130) and the content network link 135 (e.g., between the server optimizer 130 and the content servers 150 via the networks 140) can be implemented as various types of links have different and/or changing link characteristics, including, for example, differences in bandwidth, latency, cost per bit, etc. For example, the client-server communication link 125 between the server optimizer 130 and the client optimizers 120 supports one or more unicast service flows and one or more multicast service flows for supporting unicast and multicast traffic, respectively. Further, while certain embodiments are implemented in the context of a satellite communications system, where the client-server communication link 125 includes at least one satellite link, other topologies and link types are possible.

In one embodiment, the client-server communication link 125 includes a satellite communications link. It will be appreciated that satellites can effectively broadcast all their downstream traffic to all receivers that are tuned to a particular carrier, beam, etc. As such, unicasting or multicasting to one or more user systems 110 can, in fact, involve broadcasting the data over the satellite link and also broadcasting control data to direct receivers to either accept or ignore relevant portions of the broadcast data. Notably, while some system resources can be expended in setting up a multicast service flow and in related logistics, it "costs" the satellite communications system substantially the same bandwidth resources to send a packet to one user system 110 or to all user systems 110 (e.g., on a particular beam).

Similarly, in another embodiment, the client-server communication link 125 includes a cable communications link. For example, a cable company can run a cable line to a neighborhood aggregator, from which individual coaxial lines communicate last mile traffic to individual households. Each individual coaxial cable can carry all the traffic for the entire neighborhood, even where some of that traffic is destined only for particular households. As in the satellite embodiment described above, since all the cable subscriber households in the same neighborhood effectively receive all the traffic, bandwidth resources can be shared by multicasting traffic, where appropriate. Of course, satellite and cable networks are only two illustrative embodiments of client-server communication links 125. Embodiments of the client-server communication link 125 can include any type of communications link that has limited bandwidth resources, where the bandwidth resources can be at least partially shared through multicasting.

Figure 2:
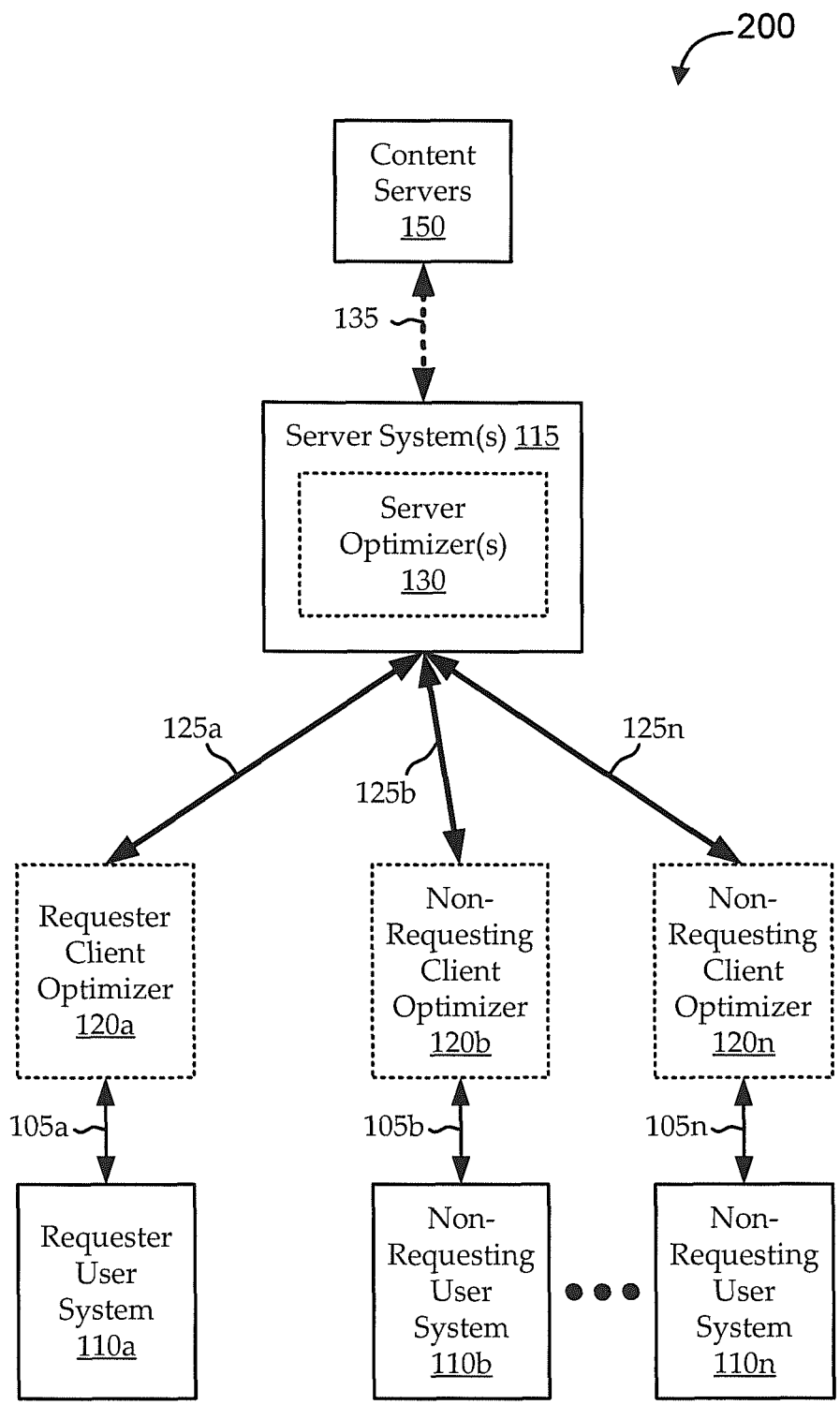
FIG. 2 shows a simplified block diagram of another embodiment of a communications system for use with various embodiments.

While the communications system 100 of FIG. 1 shows only a single user system 110, it will be appreciated that a typical communications system is configured to facilitate communications between many user systems 110 and many content servers 150 (e.g., through one or more server systems 115). FIG. 2 shows a simplified block diagram of another embodiment of a communications system 200 for use with various embodiments. The communications system 200 facilitates communications between many user systems 110 and many content servers 150 via one or more server systems 115. Each user system 110 is associated with a respective client optimizer 120 (e.g., illustrated separately for the sake of clarity only) and each server system is associated with a respective server optimizer 130. As in FIG. 1, each client optimizer 120 is in communication with other components (e.g., user applications 107) of the user system 105 over a respective local link 105, each client optimizer 120 is in communication with a server optimizer 130 over a client-server communication link 125 (e.g., which can be considered as a shared link between some or all of the client optimizer 120 in the context of multicast communications), and each server optimizer 130 is in communication with the content servers 150 over a respective content network link 135 (e.g., via one or more networks (not shown)).

While embodiments described herein can be implemented in many ways and can handle many different types of scenarios, it is helpful to consider various use cases and perspectives. According to one illustrative scenario, a particular user system 110a (illustrated as the "requester user system 110a") requests data from a content server 150 via its client optimizer 120a (illustrated as the "requester client optimizer 120a"). For this particular request transaction, other user systems 110b-110n and their respective client optimizers 120b-120n are considered as "non-requesting." In one embodiment of such a use case, the requester user system 110a issues the request as a unicast communication over its local link 105a to the requester client optimizer 120a. The requester client optimizer 120a forwards the request over its client-server communication link 125a to the server optimizer 130 of the server system 115 (e.g., or of one of the server systems 115) as a unicast communication. The server optimizer 130 issues the request as a unicast communication over its content network link 135 to the appropriate content server 150. The requested content is received from the content server 150 by the server optimizer 130 over the content network link 135 as a unicast stream. Some content from the unicast stream can be opportunistically multicast over the client-server communication links 125 (e.g., as a multicast service flow over a shared communications link) to some or all client optimizers 120 (e.g., any clients configured to listen to the multicast service flow), including at least the requester client optimizer 120a and. The requester client optimizer 120a then forwards the stream data to other components of the requester user system 110a as a unicast communication over the local link 105a.

The above scenario can be approached from the perspective of one of the non-requesting user systems 110b. As described above, in response to a content request issued by a requester user system 110a to a content server 150, some requested content received by the server optimizer 130 is opportunistically multicast over the client-server communication links 125. It is assumed that the multicast stream is received at least by the requester client optimizer 120a and the non-requesting client optimizer 120b of the non-requesting user system 110b. As explained more fully below, the received content can include both content blocks and fingerprints of those content blocks. The non-requesting client optimizer 120b can choose to (e.g., according to user preferences)

or be directed to (e.g., by the server optimizer 130) store some or all of the received content for potential later use.

According to another illustrative scenario (e.g., which can be seen as a variation of either or both of the above scenarios), the "request" can be issued by a server system 115, rather than by a user system 110. Embodiments of the server optimizer 130 include a pre-positioner configured to determine whether to push data to non-requesting client optimizers 120*b*-120*n* based, for example, on schedule, network load, user profiles, multicast groups, content popularity, etc. In one scenario, the pre-positioner pushes content to a particular client optimizer 120. For example, it can be desirable in some cases to delay responding to an explicit or implicit request for content from a user until there is a certain reduction in network load, an increase in link condition, a certain number of other requests for the same content, etc. In such a scenario, the receiving client optimizers 120 can handle the received data as if they were a requester or a non-requesting client optimizer 120. In another scenario, the pre-positioner pushes content to groups of non-requesting client optimizers 120*b*-120*n* in anticipation of potential future requests. For example, it can be desirable to anticipatorily pre-push content that is likely to be requested according to user profiles, browsing histories, content popularity, etc. In such a scenario, the receiving client optimizers 120 can handle the received data as non-requesting client optimizers 120*b*-120*n*. For example, any non-requesting client optimizers 120*b*-120*n* can choose or be directed to store the content locally in anticipation of a future request.

Notably, other functionality can be configured according to whether data is being sent opportunistically. For example, in cases where an explicit request is issued from a requester user system 110*a*, embodiments use various techniques to ensure reliable transport of the requested data at least to the requester user system 110*a*. The techniques can include selecting particular modulation and/or coding schemes, using particular transport protocols, using or avoiding certain types of compression, etc. For example, requested content can be communicated to the requester client optimizer 120*a* using a Pragmatic General Multicast ("PGM") protocol, Negative-Acknowledgment ("NACK") Oriented Reliable Multicast ("NORM"), or "RFC 3940," protocol from the Internet Engineering Task Force ("IETF"), or any other reliable multicast protocol (e.g., which can be a standard or modified protocol, or included as part of another transport protocol). Similarly, it can be desirable to multicast content to non-requesting client optimizers 120*b*-120*n* using a protocol (e.g., PGM) that does not result in NACKs, or the like, so opportunistic receivers are not compelled under the protocol to provide feedback on missed packets, etc.

While a number of embodiments are described herein with reference to specific transmissions (e.g., multicast) and related functionality, similar or identical techniques can be used in context of other protocols without departing from the scope of embodiments. In some embodiments, content blocks and/or fingerprints are multicast to the requester user system 110*a* and to other non-requesting user systems 110*b*-110*n* (e.g., other users on a same satellite carrier or spot beam, or otherwise able to "listen in" to or join the multicast service flow). For example, environments that use opportunistic techniques to anticipatorily pre-position content can be designed to opportunistically multicast whatever data (e.g., content blocks, etc.) that could potentially be of interest to other non-requesting user systems 110*b*-110*n*. In other embodiments, content blocks and/or fingerprints are unicast only to the requester user system 110*a*. For example, when a user system 110 requests a particular content object that has pre-viously been requested by the same user system 110, some or all of the content blocks associated with that content object are likely to be identical to those previously received and stored by the user system 110 (e.g., assuming the content object has not changed significantly). Similar situations can arise in peer-to-peer environments, and similar techniques can be applied. For example, one user can receive blocks of content data for the same content object from multiple sources, and techniques can be used to reduce redundant communications of those content blocks to the user. Similarly, a user can attempt to send content to another user that already has a copy of that content in local storage. In any of the above or other scenarios, novel techniques described herein can be used to reduce redundant communications of content data without involving large amounts of storage or communications overhead at the intermediate server.

Figure 3:
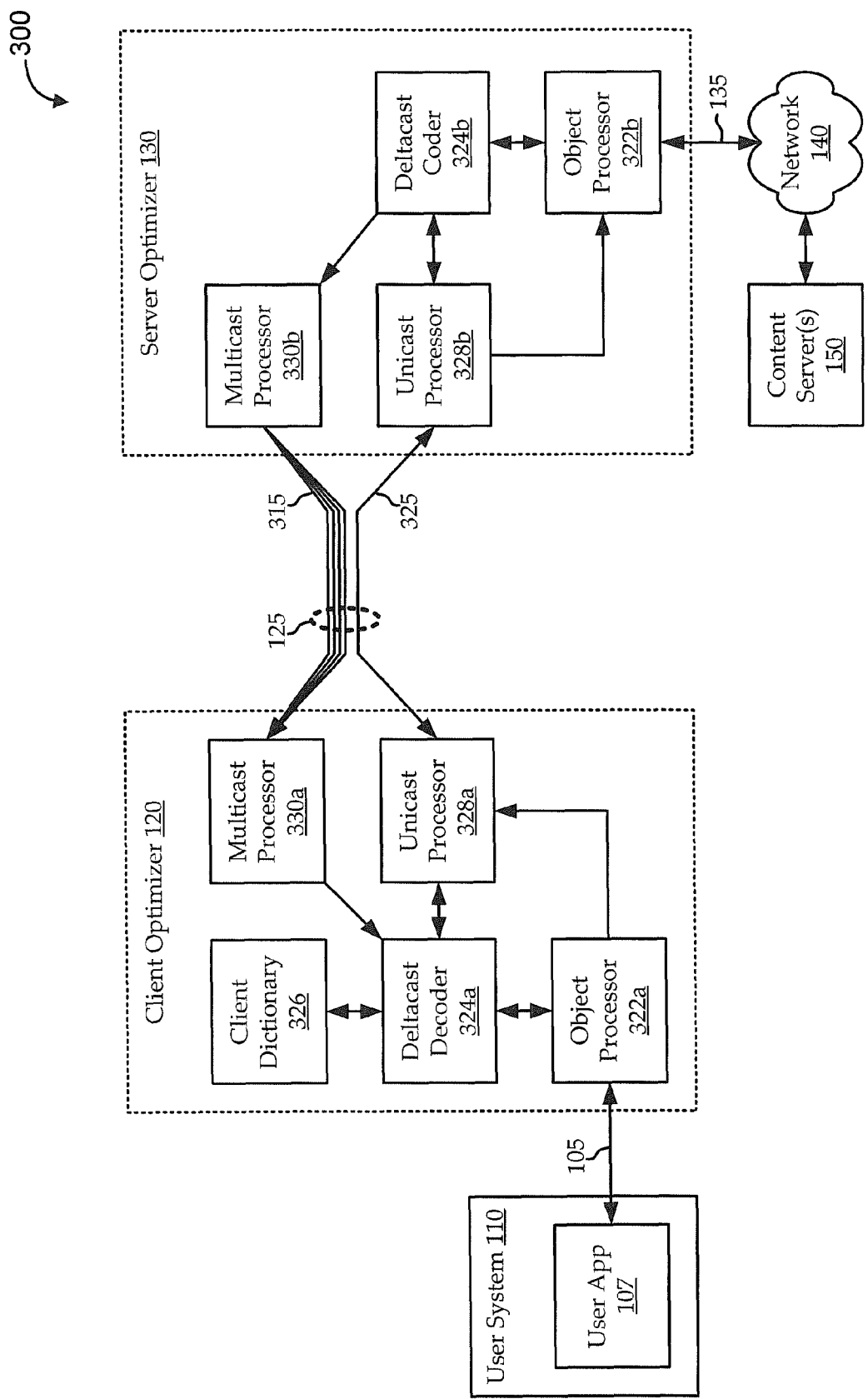
FIG. 3 shows a block diagram of an embodiment of a communications system, illustrating client-server interactivity through a client optimizer and a server optimizer, according to various embodiments.

FIG. 3 shows a block diagram of an embodiment of a communications system 300, illustrating client-server interactivity through a client optimizer 120 and a server optimizer 130, according to various embodiments. In some embodiments, the communications system 300 is an embodiment of the communications systems 100 or 200 of FIG. 1 or 2, respectively. As shown, the communications system 300 facilitates communications between a user system 110 and one or more content servers 150 via a respective local link 105, at least one client-server communication link 125, and at least one content network link 135. In some embodiments, the content network link 135 includes links through a network 140, like the Internet. Also, as illustrated, embodiments of the client-server communication link 125 support one or more unicast service flows 325 and one or more multicast service flows 315. As discussed above, embodiments of the user system 110 include one or more user applications 107 that can benefit from optimization functionality provided by the client optimizer 120 and/or the server optimizer 130.

It is worth noting that the client optimizer 120 is shown as separate from the user system 110 (e.g., in communication over a local bus, on a separate computer system connected to the user system 110 via a high speed/low latency link, like a branch office LAN subnet, etc.). However, embodiments of the client optimizer 120 are implemented as part of the user system 110 in any useful client-side location, including as part of a user terminal, as part of a user modem, as part of a hub, as a separate hardware component, as a software application on the client machine, etc.

In one embodiment, the client optimizer 120 includes an object processor 322*a*. The object processor 322*a* can be configured to perform a number of different processing functions, including Java parsing and protocol processing. Embodiments of the object processor 322*a* can process hypertext transfer protocol (HTTP), file transfer protocol (FTP), various media protocols, metadata, header information, and/or other relevant information from the request data (e.g., packets) to allow the client optimizer 120 to perform its optimizer functions. In some embodiments, the object processor 322*a* sends the processed request data to a unicast processor 328*a*.

The processed and/or coded request data can then be further processed by the unicast processor 328*a* in some embodiments in preparation for communicating the data over the client-server communication link 125 (e.g., as private IP traffic). In various embodiments, the unicast processor 328*a* processes the data according to one or more protocols, for example a unicast protocol, depending at least on the type of communication links implemented as part of the client-server communication link 125. For example, the client-server communication link 125 can include a wireless link, a cellular link, a satellite link, a dial-up link, etc. In certain embodiments, the unicast processor 328a is configured to implement the Intelligent Compression Technology (ICT) Transport Protocol (ITP). In one embodiment, ITP maintains a persistent connection between the client optimizer 120 and the server optimizer 130. The persistent connection can enable the communications system 300 to reduce or eliminate inefficiencies and overhead costs associated with creating a new connection for each request.

In some embodiments, the communication is received at the other end of the client-server communication link 125 by a unicast processor 328b in the server optimizer 130. In some embodiments, the unicast processor 328b in the server optimizer 130 is implemented as substantially an identical component to the unicast processor 328a in the client optimizer 120. In other embodiments, implementations of the unicast processors 328 can be tailored to their location (e.g., in the client optimizer 120 or the server optimizer 130). When the request data is received by the unicast processor 328b, the unicast processor 328b can process the request according to the applied one or more protocols. For example, the unicast processor 328b can be configured to implement ITP, such that data sent from the unicast processor 328a according to the ITP protocol can be processed accordingly.

As discussed above, the data received at the server optimizer 130 from the client optimizer 120 can be processed (e.g., according to one or more protocols, like HTTP) by an object processor 322b. In some embodiments, the object processor 322b processes (e.g., translated, decoded, etc.) the request into a format that is accessible to a source of the requested content (e.g., a website), or otherwise handles aspects of the request, such as cookies, etc.

Embodiments of the object processor 322b can then forward the request to an appropriate destination (e.g., a content server 150) over the content network link 135 (e.g., via a network 140). The content network link 135 can include, for example, a cable modem connection, a digital subscriber line (DSL) connection, a T1 connection, a fiber optic connection, etc. As discussed above, in some embodiments of the communications system 300, the content network link 135 manifests substantially lower latency than that of the client-server communication link 125. Also, typically, the request is sent over the content network link 135 as a unicast communication.

Response data can be received by the object processor 322b, in response to the request, from the appropriate destination (e.g., the content server 150) over the content network link 135. The response can be received as a unicast communication, or, in some instances, as a multicast communication. Embodiments of the object processor 322b can be configured to interpret the response data, which can, for example, be received as HTML, XML, CSS, Java Scripts, or other types of data. In some cases, the response data includes a content stream. As used herein, a "content stream" can include any type of content having a relatively predictable order of received data over an appreciable amount of time. For example, the data representing streaming media (e.g., Internet radio, streaming audio and/or video, etc.) is likely to be received in the same order each time it is requested.

The response data can be passed from the object processor 322b to a deltacast coder 324b. As described more fully below, a fingerprint of the response data can be generated by the deltacast coder 324b (e.g., using dictionary coding techniques) and used for various types of deltacasting and/or other optimization functions. The fingerprints can be generated using deterministic chunking. The fingerprint can be used to determine how to further handle the response data, as described below. In some embodiments, processed and/or coded (e.g., compressed) response data is sent over the client-server communication link 125 to the client optimizer 120. The data can be sent as a unicast service flow 325 from the unicast processor 328b in the server optimizer 130 to the unicast processor 328a in the client optimizer 120; and/or the data can be sent as one or more multicast service flows 315 from the multicast processor 330b in the server optimizer 130 to the multicast processor 330a in the client optimizer 120. In certain embodiments, standard protocols are adapted for use with the unicast service flows 325 and/or the multicast service flows 315. For example, embodiments opportunistically multicast content blocks representing the requested content stream data to requester and non-requesting client optimizers 120, while also communicating certain fingerprint and messaging data over a unicast service flow 325 to the requester client optimizer 120.

Further, when the client-server communication link 125 includes multiple multicast service flows 315, the multicast service flows 315 can be configured in various ways. In various embodiments, for example, the multicast service flows 315 are configured to each communicate at a different modcode point, on a different spot beam, and/or on a different carrier. This can allow for more efficient communication of traffic to groups of user systems 110 having particular characteristics. For example, if certain traffic is determined to be destined for a user system 110 capable of communicating at a particular modcode point, the traffic can be multicast on a multicast service flow 315 that operates at or near this modcode point for maximum efficiency (e.g., rather than at the lowest modcode point needed to transmit to all user systems 110 in the multicast group). While this can, in certain cases, cause some of the user systems 110 in the multicast group to be unable to reliably receive all the multicast data, there can still be an overall improvement in the operation of the communications system 300.

In other embodiments, modcodes can be handled (e.g., selected, adapted, optimized, etc.) for various affects. In one embodiment, as described above, the modcode is selected according to link conditions between the server optimizer 130 and the client optimizer 120 associated with a requesting client, if any (i.e., so that at least the requesting client can reliably receive the communication). In another embodiment, the modcode is selected so that at least some threshold group (e.g., number) of clients can reliably receive the communication. In still other embodiments, the modcode is adapted to changes in link conditions between the server optimizer 130 and one or more client optimizers 120. For example, adaptive coding and modulation techniques can be used. The modcode can be adapted by estimating or monitoring link conditions from the server-side (e.g., estimating signal-to-noise ratios, bandwidth, etc.) or via feedback from the client-side. In one embodiment, the client optimizer 120 communicates information, like whether packets are reliably received, as feedback to the server optimizer for dynamically adjusting the modcode.

The data received at the client optimizer 120 from the server optimizer 130 can be coded (e.g., dictionary coded) and/or otherwise processed (e.g., according to one or more protocols, like HTTP). Embodiments of the object processor 322a and the deltacast decoder 324a in the client optimizer 120 are configured to handle processing and/or decoding of the response data, respectively. For example, the unicast processor 328a and the multicast processor 330a can send received data to a deltacast decoder 324a. The deltacast decoder 324a can perform various delta decoding-related functions, such as fingerprint handling, to handle both data received in response to a request and data received opportunistically. In some implementations, the client dictionary 326 and/or additional storage at or in communication with the client optimizer 120 can be used to store information, including content blocks, fingerprints of content blocks, orders in which content blocks were previously received, error correction information, network statistics, etc.

Embodiments of the deltacast decoder 324a pass decoded response data to the object processor 322a. For example, as explained more fully below, a request for a content stream can be fulfilled using some blocks of data downloaded from the server optimizer and some blocks of data retrieved from the local client dictionary 326. The deltacast decoder 324a is used to handle the downloaded and locally retrieved content block data, fingerprint data, and any other data (e.g., control data, transport data, etc.) to provide response data to the object processor 322a that appropriately fulfills the request from the user system 110. Embodiments of the object processor 322a can then forward the decoded and/or otherwise processed response data to the user system 110 (or to other components of the user system 110, where the client optimizer 120 is part of the user system 110). The response can then be used by components of the user system 110. For example, a received content stream received as part of the response data can be played back through a media player (e.g., the user application 107) at the user system 110.

It will be appreciated that embodiments can be used to process many different types of requests and response data in many contexts. For example, embodiments of the communication system 300 are used to provide various Internet services (e.g., access to the world-wide web, file serving and sharing, etc.), television services (e.g., satellite broadcast television, Internet protocol television (IPTV), on-demand programming, etc.), networking services (e.g., mesh networking, VPN, VLAN, MPLS, VPLS, etc.), and other communication services including other downloadable and on-demand types of communications. As such, the "response" data discussed above is intended only as an illustrative type of data that can be received by the server optimizer 130 from a content source (e.g., a content server 150). For example, the "response" data can actually be pushed, multicast, or otherwise communicated to the user without an explicit request from the user.

It will be further appreciated that many features described herein are realized through deltacasting functionality, much of which is implemented through transport management. According to some embodiments, some or all of the unicast processors 328, multicast processors 330, deltacast coder 324b, and deltacast decoder 324a are implemented as functional components of a larger deltacast protocol handler. For example, all communications are sent over the client-server communication link 125 generally as deltacast communications, and deltacast protocol handling is used to determine which portions of the communications are sent over unicast service flows 325, which are sent over multicast service flows 315, and how those communications are handled at either end of the link.

Communications systems, including those illustrated in FIGS. 1, 2, and 3, can be used to perform functions according to various method embodiments described below with reference to FIGS. 4 and 4. However, it will be appreciated that method embodiments can be implemented in other contexts, for example, using different types of communications systems, user systems, server systems, etc. Accordingly, while certain method embodiments are described in context of particular systems or components for the sake of clarity, those descriptions are intended for the sake of clarity and not as limiting the scope of those method embodiments.

Figure 4:
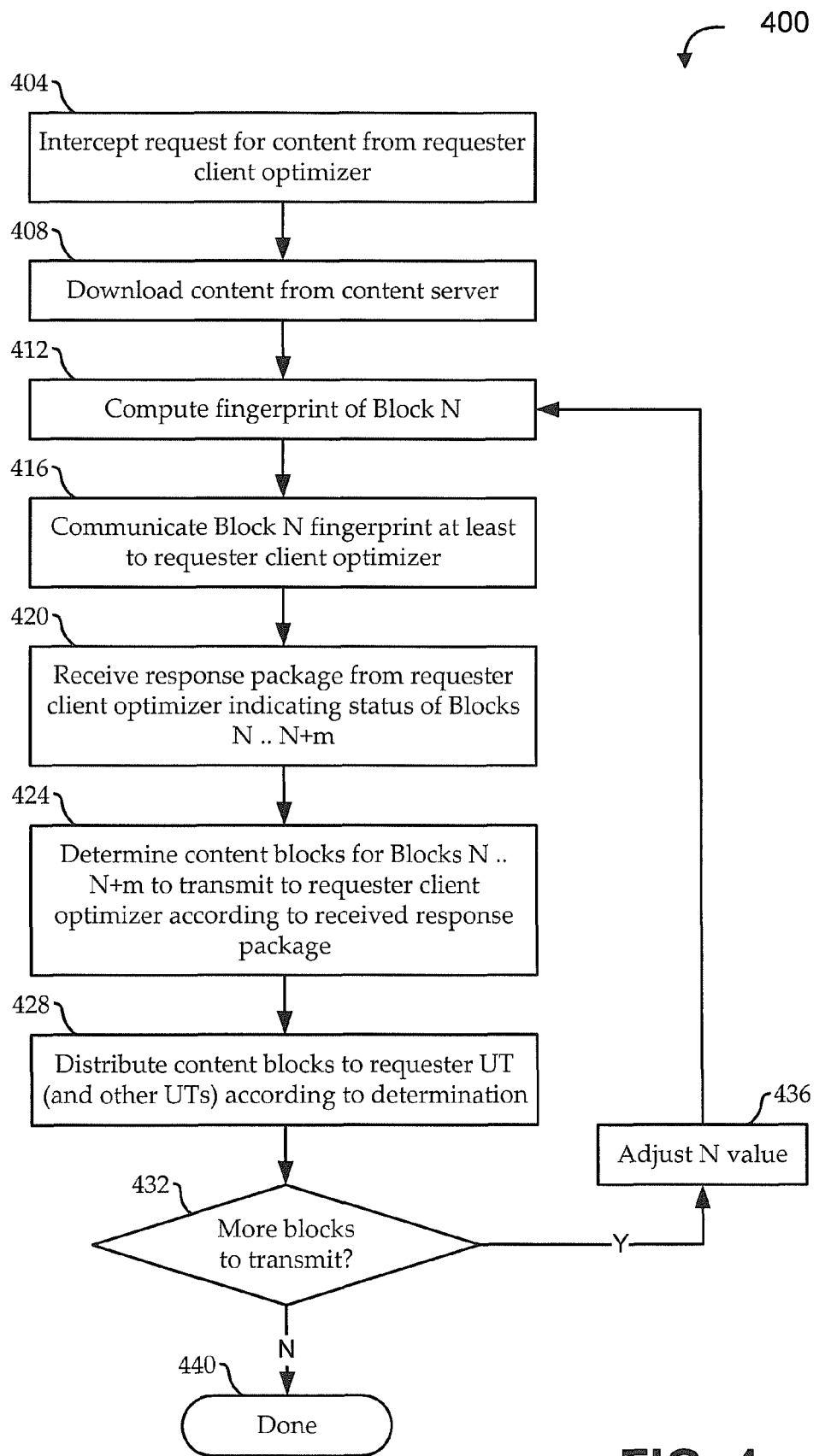
FIG. 4 shows a flow diagram of an illustrative method for using a server system to opportunistically multicast data using delta coding techniques, according to various embodiments.

Turning to FIG. 4, a flow diagram is shown of an illustrative method 400 for using a server system to opportunistically multicast data using delta coding techniques, according to various embodiments. Embodiments of the method 400 begin at stage 404 by intercepting a request for content from a requester user system. For example, the request is made by a client optimizer 120 of a user system 110 for content from a content server 150, and is intercepted by a server optimizer 130 of a server system 115. The server optimizer 130 can then make the request to the content server 150 on behalf of the client (e.g., as a proxy).

While the method is described in context of intercepting a request, other implementations and scenarios are possible without departing from the scope of embodiments. In some scenarios, client optimizers 120 are associated with preferences, subscriptions, and/or the like. For example, a client optimizer 120 is associated with a subscriber that subscribes to certain content streams, with a subscriber that explicitly provides preferences (e.g., through a preference portal, subscriber registration, survey, etc.), with a subscriber that implicitly provides preferences (e.g., through statistical or trend analysis of past viewing history of that subscriber and/or other subscribers), etc. In any of those or other scenarios, the server optimizer 130 (e.g., alone or with additional information or instruction from other systems) can determine that certain client optimizers 120 would likely desire to receive certain content. The server optimizer 130 can either request that content on behalf of client optimizers (e.g., periodically, overnight, etc.), or the server optimizer can opportunistically make those determinations as content is received at the server optimizer 130. For example, when one user requests content, the content response can be intercepted by the server optimizer, and the server optimizer can determine which other client optimizers 120 would likely desire that content. The server optimizer can then proceed with stages of the method 400 in a similar or identical manner as if the client optimizer had requested the content explicitly.

At stage 408, the server optimizer 130 downloads content from the content server 150 in response to its request. In some embodiments, the server optimizer 130 determines whether the content is part of a content stream, as discussed above. For example, certain embodiments can only process the downloaded data according to the method 400 when it is determined that the downloaded data includes (e.g., and/or the request is for) a content stream. Further, some embodiments deterministically chunk the data into blocks substantially as it is downloaded. For example, as packets of the content stream are received, byte sequences are detected and used to repeatably inform chunking of the data. For the sake of clarity, the chunked data will be referred to as "content blocks," where the nth content block is named "Block N."

At stage 412, a fingerprint is generated for one of the downloaded and chunked blocks. For example, as the download begins, a fingerprint can be generated for the first content block (e.g., Block 0). At some point during the download, as illustrated, a fingerprint is generated at stage 412 for Block N. In some embodiments, the fingerprint is generated at block 420 by the deltacast coder 324b of the server optimizer 130.

In certain embodiments, the fingerprint is generated using cryptographic hash functions (e.g., generated by a Message-Digest algorithm 5 (MD5) technique), non-secure hash functions (e.g., generated by a cyclic redundancy check (CRC) technique), or other similar techniques. In other embodiments, the fingerprint can be generated in any way, such that the resulting fingerprint can be used to indicate that one particular byte sequence (or a portion of the byte sequence) matches another particular byte sequence (e.g., or a portion of another byte sequence). Embodiments of dictionary coding (e.g., particularly delta coding) and related techniques are described in more detail in U.S. Pat. No. 8,010,705, entitled "METHODS AND SYSTEMS FOR UTILIZING DELTA CODING IN ACCELERATION PROXY SERVERS," filed on Jun. 3, 2009, which is incorporated herein by reference for any and all purposes.

In some embodiments, the fingerprint is essentially a compressed version of the byte sequence. In other embodiments, the fingerprint is a checksum, hash, or other technique applied to some or all of the object data. For example, in one embodiment, a checksum of the first portion of the byte sequence (e.g., the first megabyte of data) is used as a fingerprint. This fingerprint can then be compared to other fingerprints to find a match. As will be described more fully below, embodiments use the fingerprints and fingerprints received from client optimizers 120 to determine whether blocks of data being presently downloaded were previously sent to and stored at (e.g., opportunistically pre-positioned) a user system 110. If resending the block can be avoided, very high compression of the data can be possible (e.g., in some cases, 800-to-1 compression is available using the client dictionary 226). Similarly, while different embodiments can generate different sizes of blocks, it can be inefficient to generate very small blocks of data. For example, generating smaller blocks can result in generating fingerprints at high speeds and high densities, which can increase resource usage and increase the size of the client dictionaries 226.

At stage 416, the fingerprint of Block N generated in stage 412 is communicated at least to the requester client optimizer 120. For example, the fingerprint is sent as a unicast service flow 325 over the client-server communication link 125 via the unicast processors 328, along with any relevant control data, to the corresponding user system 110. In alternative embodiments, the fingerprint is multicast to a number of client optimizers 120, including the requesting client optimizer. For example, the fingerprint is multicast over one or more multicast service flows 315 to the client optimizers 120 via the multicast processors 330.

Whenever multicasting is used in embodiments described herein, it can be implemented in various ways. In one illustrative embodiment, content is multicast to a number of users sharing a satellite spot beam in a satellite communications network. The content is broadcast over a satellite link with a stream identifier that designates it as a multicast stream. Control data is also sent directing user systems 110 associated with interested users to "listen" to the multicast stream (e.g., to accept, rather than ignore, data with that stream identifier as it is received). In effect, this creates a multicast group of the interested users. In different embodiments, the control data can be communicated to the multicast group either as respective unicast service flows 325 to each client via the unicast processors 328 or as part of a multicast control channel sent over a multicast service flow 315 via the multicast processors 330. It will be appreciated that, for the sake of bandwidth efficiency, embodiments can send the control data over the multicast control channel. For example, all the user systems 110 can be constantly listening to the multicast control channel to find out (e.g., among other things) which streams they should accept. Of course, other implementations are possible according to various embodiments for unicasting or multicasting the data over various unicast service flows 325 and/or multicast service flows 315 to the client optimizer(s) 120.

At stage 420, a response package is received from the requester client optimizer indicating the status of previously received content blocks in relation to Block N. In some embodiments, the response package includes fingerprints of some number of content blocks that were received subsequent to Block N the last time Block N was received (e.g., and can or with or without the fingerprint of Block N itself). For example, suppose that the last time the requester client optimizer received Block N (e.g., from its own prior request, or from any other request of another client optimizer or pre-pushing that resulted in receipt of Block N by the requester client optimizer), it subsequently received Block A, Block B, Block C, and Block E. The requester client optimizer stored those blocks, stored their corresponding fingerprints, and kept track of the receipt order. This time, when the requester client optimizer receives Block N, it can send back to the server optimizer a response package including fingerprints for Block A, Block B, Block C, and Block E.

As illustrated by stage 420, this sequence of subsequent blocks can be generally described as "Blocks N . . . N+m." Various embodiments of response packages can include different types of information and/or information relating to different numbers of subsequent blocks. For example, a balance is determined between minimizing the upstream resources used in communicating the response package while maximizing the downstream compression savings realized from not having to resend content blocks. Some embodiments dynamically determine the parameters of the response package (e.g., the number of subsequent blocks for which information is sent), while the parameters in other embodiments are fixed. For example, the number of subsequent blocks' fingerprints sent as part of the response package can be affected by the link condition between the client optimizer 120 and server optimizer 130; better link conditions can allow for lower-overhead communications, which can support larger numbers of fingerprints to be communicated with a similar amount of bandwidth. According to one embodiment, the content data is communicated to the client optimizer 120 and/or the fingerprint data is uploaded to the server optimizer 130 at the rate (e.g., a link rate) that the requester client optimizer is consuming the input data (e.g., the content stream). According to another embodiment, the content data is communicated to the client optimizer 120 and/or the fingerprint data is uploaded to the server optimizer 130 at the rate at which an end user is consuming the data (e.g., an encoding rate). For example, embodiments detect that a video stream is encoded at 1 megabit per second, but the link can support 20 megabits per second. Rather than sending the video stream at 20 megabits per second, the video stream may instead send the video stream at closer to 1 megabit per second (e.g., 1.2 megabits per second). For example, this can free up additional bandwidth for other uses without impacting the user experience. Further, in some implementations, rather than uploading all fingerprints associated with a stream when a block match occurs, only fingerprints associated with the next blocks that are expected to be transmitted are uploaded.

At stage 424, a determination is made as to which content blocks to send (or re-send) to the requester client optimizer according to the response package. For example, after sending the fingerprint for Block N to the requester client optimizer, subsequent content is downloaded, Blocks A'-E' are generated, and fingerprints are calculated for each of those blocks, as described with reference to stages 404-412. The response package includes fingerprints for Blocks A, B, C, and E. This indicates that the last time Block N was received by the requester client optimizer, it subsequently received Blocks A, B, C, and E. Each fingerprint received for Blocks A, B, C, and E is compared to the fingerprint generated for Blocks A', B', C', and E', respectively. It is determined according to their respective fingerprints that Blocks A, B, and E match blocks A', B', and E', respectively. It can be assumed based on this illustrative scenario that the requester client optimizer previously received and has already stored a content block equivalent to Block N (otherwise it would not have recognized the corresponding fingerprint and sent the response package) and content blocks equivalent to Blocks A', B', and E'. It can be further assumed according to the illustrative scenario that the requester client optimizer did not previously receive (or did not store) a content block equivalent to Block D', and that its version of Block C is not equivalent to Block C' (e.g., the data has since changed, the data is corrupted, etc.). Accordingly, the requester client optimizer should be able to reconstruct the corresponding portion of the content stream by receiving new versions of only Blocks C and D and using previously stored, local versions of Blocks A, B, and E.

In some embodiments, additional information and/or processing is used to determine whether any blocks or sub-blocks have missing or incorrect (e.g., changed or corrupted) data. For example, if some of the blocks were previously received with errors or holes, the requester client optimizer can respond with the fingerprint match plus a list of missing packets. Alternatively, if the blocks were previously sent with large block forward error correcting codes (e.g., Low Parity Density Check codes), the requester client optimizer can respond with an indication of the amount of error loss that was incurred. The server optimizer 130 can then send only the missing packets or additional error correction codes to fill the holes.

At stage 428, content blocks are distributed at least to the requester client optimizer according to the determination. For example, analysis of the response package in stage 424 can result in a determination that only five of the next fifty blocks need to be communicated in full to the requester client optimizer, and portions of ten other blocks need to be re-sent to the requester client optimizer. In some embodiments, the content blocks are transmitted by unicast to the requester client optimizer. In other embodiments, the content blocks are communicated over one or more multicast service flows 315 to multiple client optimizers, including both the requester client optimizer and non-requesting client optimizers. The non-requesting client optimizers can determine (e.g., based on user preferences and/or other parameters) whether to store the content blocks.

Some embodiments communicate the content blocks along with fingerprints of those blocks. The content blocks and respective fingerprints can be stored by some or all of the receiving client optimizers (e.g., in their respective client dictionaries 326 and/or in other storage). In alternative embodiments, the content blocks are communicated to the client optimizer(s) and some or all of the client optimizer(s) generate and store fingerprints for those blocks (e.g., that are equivalent to fingerprints generated at the server optimizer 130).

As described above, multiple scenarios exist in which the server optimizer 130 is attempting to communicate reliably with one or more clients, though other clients can receive some or all of the communicated data opportunistically. For example, a particular group of clients is identified for reliable receipt of the communications. A transport scheme (e.g., a coding and modulation scheme) can be selected to ensure reliable receipt of the content blocks by the requester client optimizer, even if the blocks are not reliably received by some or all of the non-requesting client optimizers. The transport scheme can be static or dynamic, and can alternatively be configured to be selected according to other parameters (e.g., to provide reliable transport to a set of preferred client optimizers, to a select multicast group, etc.). Additionally or alternatively, the content block and/or fingerprint data can be compressed and/or otherwise coded before it is sent over the client-server communication link 125. In one embodiment, the data is coded (e.g., Gzip coded, L-Z coded, etc.) prior to being sent over the client-server communication link 125. When the zipped data is received at the client optimizer 120, the data is added to the client dictionary 326 or other client-side storage in compressed (e.g., zipped) or decompressed form after further processing. Further, some implementations may receive (or pay attention to) response packages only from those clients that are part of the group identified for reliable receipt of the communications. For example, those clients can receive information via the control channel instructing them to generate response packages; all clients generate response packages, but most are ignored by the server optimizer 130; etc.

In some embodiments, Block N is sent regardless of what information is received as part of the response package. For example, there can be some latency between sending the Block N fingerprint at stage 416, receiving the response package at stage 420, and sending content blocks in response to that response package at stage 428. Accordingly, it can be desirable to begin sending the content block for Block N along with (e.g., or shortly subsequent to) sending the other content blocks in stage 428. While a small amount of compression can be lost, there can still be a reduction in apparent latency to the end consumer of the data. For example, this can be useful in satellite communications systems or other higher-latency network environments. Other embodiments wait to send Block N until a response package is received.

The method 400 can effectively iterate until no more blocks remain to be sent for the requested content. For example, no more blocks can remain to be transmitted when a user navigates away from a streaming media clip, closes a streaming media application, stops or cancels downloading of media, the media download is complete, or no more data is otherwise desirable to communicate. At stage 432, a determination is made as to whether more blocks remain to be transmitted. If no more blocks remain, the method 400 can be complete, as illustrated by stage 440. Notably, in some embodiments, the method 400 being complete can involve the method 400 iterating between stages 404 and 408 waiting for another content request that invokes the remainder of the method (e.g., another request for a content stream). If more blocks remain, the method 400 can iterate in various ways by adjusting the value of N in stage 436 and returning to stage 412 with the new N value.

In one embodiment, N is set to N+1, so that the method 400 effectively looks next at Block N+1. For example, after sending a fingerprint of Block N and receiving a response package indicating that Blocks A, B, and C are needed, the server optimizer 130 begins sending Blocks A, B, and C with their respective fingerprints. According to the above embodiment, a response package can now be received (in response to receiving the fingerprint for Block A) indicating that Blocks B and C are needed (e.g., assuming that, due to latencies, the requester client optimizer has not yet updated its client dictionary 326 to indicate that it has Blocks B and C stored locally). Certain embodiments keep a record of the last number of blocks sent to avoid sending Blocks B and C multiple times. Other blocks can use techniques to account for the latency and wait to send subsequent blocks until they are requested.

Alternatively, embodiments set N to N+m+1 in stage 436. For example, after sending a fingerprint of Block N, the server optimizer 130 receives a response package indicating that Blocks A, B, and E are already stored at the requester client optimizer, but Blocks C, D, and F are needed. The server optimizer 130 begins sending Blocks C, D, and F with their respective fingerprints. The server optimizer 130 can then set N to "G" (i.e., the next block after Block F). For example, since the original response package revealed information about Blocks A-F, it can be unnecessary to receive any information for those blocks again. This type of approach can involve additional coordination. For example, is can be pre-negotiated or pre-determined that each response package will include information about the next ten blocks.

Figure 5:
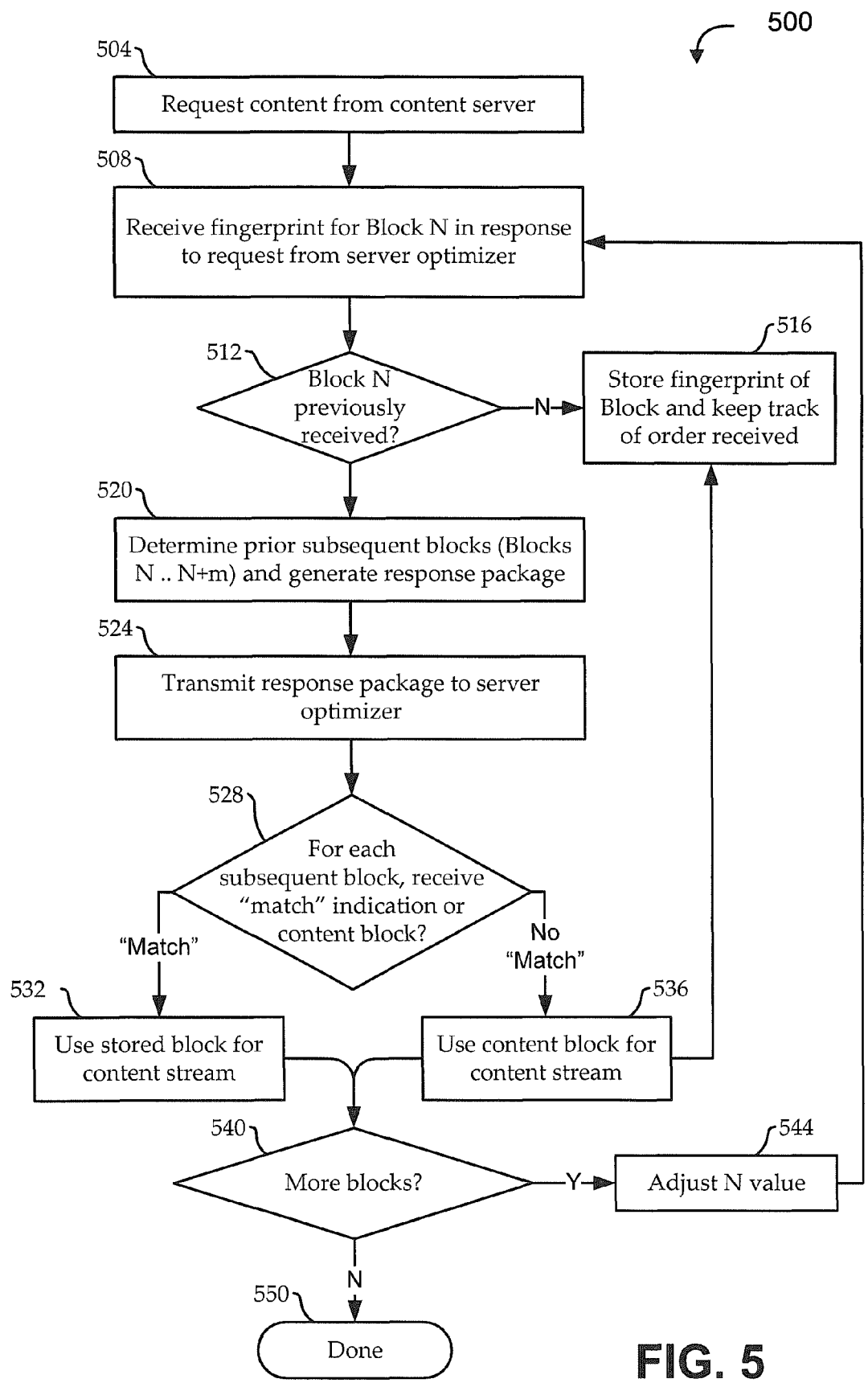
FIG. 5 shows a flow diagram of an illustrative method for using a client system in context of opportunistic multicasting of data using delta coding techniques, according to various embodiments.

Functionality of various embodiments can be described and/or facilitated from the perspective of the requester client optimizer. FIG. 5 shows a flow diagram of an illustrative method 500 for using a client system in context of opportunistic multicasting of data using delta coding techniques, according to various embodiments. The method 500 begins at stage 504 by requesting content from a content server. As discussed above, the client optimizer 120 can request content by transmitting a request issued by a web browser 314 or other application of its respective user system 110. Rather than the request being communicated directly to the content server over the public Internet, it is assumed that the request is intercepted by a server optimizer 130. For example, the requester client optimizer and the server optimizer 130 act as a proxy client and a proxy server.

At stage 508, a fingerprint is received from a server optimizer 130 in response to the content request. For example, the first content block generated by the server optimizer 130 during downloading of the requested content is illustrated as Block N, and the fingerprint received in a first iteration of stage 508 for the content request corresponds to Block N. At stage 512, the requester client optimizer determines whether Block N was previously received. Embodiments look in the client dictionary 326 for a matching fingerprint (e.g., or a fingerprint indexed as the fingerprint for Block N). If it is determined that the block was not previously received, the requester client optimizer stores the fingerprint (e.g., in its client dictionary 326) at stage 516. The requester client optimizer can also keep track of the order in which subsequent blocks are received and can store the content block when later received. In some embodiments, the client optimizer 120 makes a further determination as to whether it desires to store the block at all. For example, where the receiving client optimizer 120 is the requester client optimizer, it can store the block and related information by default, while non-requesting client optimizer(s) can make the further determination (e.g., based on user preferences, likelihood of future request, or other parameters).

If it is determined that Block N was previously received, the requester client optimizer can determine a set of subsequent blocks that were received the last time Block N was received and generate a response package, accordingly, at stage 520. Suppose that the requester client optimizer previously received Block N followed by Blocks A, B, D, and E. At stage 520, the requester client optimizer can generate a response package with fingerprints corresponding to Blocks A, B, D, and E. Notably, Block N can have been received in the past from a prior request for the data by the requester client optimizer, from opportunistic pre-positioning (e.g., receiving the data as part of a multicast in response to a request for the data from a different client optimizer), etc. As discussed above, embodiments can have a set number of subsequent blocks (e.g., "m") for which data is returned in the response package, so that the response package indicates data for Blocks N to N+m. Alternatively, the value of "m" can be dynamically computed according to link condition data.

At stage 524, the response package is transmitted to the server optimizer 130. As discussed above, the requester client optimizer can begin to receive data in response to the content request and to the response package. It will be appreciated that, while the requester client optimizer knows which blocks it has according to its own client dictionary 326 and generated its response package accordingly, some or all of those blocks can be incorrect (e.g., missing packets, stale, etc.). Accordingly, some embodiments of the server optimizer 130 send data to the requester client optimizer for every block requested, even when there is a "match" so the requester client optimizer knows to use the stored version of the content block only when it is the correct version of the block.

At stage 528, the requester client optimizer determines, for each block of the requested content, whether corresponding data coming from the server optimizer 130 indicates a match or includes a content block. If the determination indicates that the requester client optimizer already has a matching block in its local storage, the requester client optimizer uses the locally stored version of the block at stage 532 in responding to the request for that content block. If the determination indicates that a content block has been sent (i.e., that the requester client optimizer does not have a matching block in its local storage), the requester client optimizer uses the newly received version of the block at stage 536 in responding to the request for that content block. In some embodiments, the content block and corresponding data (e.g., fingerprint, receipt order, etc.) are stored local to the requester client optimizer.

The method 500 can effectively iterate until no more blocks remain to be received in response to the content request (e.g., or until the request is halted). Regardless of whether a previously stored version or a newly received version of the content block is used, at stage 540, a determination is made as to whether more blocks remain to be transmitted. If no more blocks remain, the method 500 can be complete, as illustrated by stage 550. If more blocks remain, the method 500 can iterate in various ways by adjusting the value of N in stage 544 and returning to stage 508 with the new N value. As discussed above, altering the N value at stage 544 can include setting N to N+1, setting N to N+m+1, or any other useful adjustment (e.g., that has been pre-negotiated or preset in conjunction with the server optimizer 130).

The various operations of methods described above can be performed by any suitable means capable of performing the corresponding functions. The means can include various hardware and/or software component(s) and/or module(s), including, but not limited to a circuit, an application specific integrated circuit (ASIC), or processor.

The various illustrative logical blocks, modules, and circuits described can be implemented or performed with a general purpose processor, a digital signal processor (DSP), an ASIC, a field programmable gate array signal (FPGA), or other programmable logic device (PLD), discrete gate, or transistor logic, discrete hardware components, or any combination thereof designed to perform the functions described herein. A general purpose processor can be a microprocessor, but in the alternative, the processor can be any commercially available processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure, can be embodied directly in hardware, in a software module executed by a processor, or in a combination of the two. A software module can reside in any form of tangible storage medium. Some examples of storage media that can be used include random access memory (RAM), read only memory (ROM), flash memory, EPROM memory, EEPROM memory, registers, a hard disk, a removable disk, a CD-ROM and so forth. A storage medium can be coupled to a processor such that the processor can read information from, and write information to, the storage medium. In the alternative, the storage medium can be integral to the processor. A software module can be a single instruction, or many instructions, and can be distributed over several different code segments, among different programs, and across multiple storage media.

The methods disclosed herein comprise one or more actions for achieving the described method. The method and/or actions can be interchanged with one another without departing from the scope of the claims. In other words, unless a specific order of actions is specified, the order and/or use of specific actions can be modified without departing from the scope of the claims.

Other examples and implementations are within the scope and spirit of the disclosure and appended claims. For example, due to the nature of software, functions described above can be implemented using software executed by a processor, hardware, firmware, hardwiring, or combinations of any of these. Features implementing functions can also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein can be utilized. Accordingly, the appended claims include within their scope such processes, machines, manufacture, compositions of matter, means, methods, or actions.

What is claimed is:

1. A method for communicating content data from a server optimizer to client optimizers over a communications network, the method comprising: determining, by the server optimizer, to communicate content data to a client optimizer; chunking the content data into a first content block and a set of subsequent content blocks; computing server fingerprints of each of the first content block and the set of subsequent content blocks; communicating a first fingerprint corresponding to the first content block from the server optimizer to the client optimizer; receiving a response package at the server optimizer from the client optimizer, the response package comprising a sequence of client fingerprints, wherein the response package is generated by the client optimizer only when the client optimizer determines that it is one of the first set of client optimizers in relation to the content data and in response to determining that a client fingerprint of the first locally stored content block matches the received first fingerprint, the first locally stored content block having been received and stored by the client optimizer prior to receiving the first server fingerprint from the server optimizer, the first locally stored content block being associated with the sequence of client fingerprints representing a set of next content blocks that were received and stored by the client optimizer directly after receipt of the first locally stored content block in sequence; determining, for each of the set of subsequent content blocks, whether the corresponding server fingerprint indicates equivalence to one of the locally stored content blocks according to its respective client fingerprint received as part of the response package; and communicating a subset of the set of subsequent content blocks from the server optimizer to the client optimizer according to the determination by the server optimizer to communicate the content data to the client optimizer, such that the corresponding server fingerprint of each communicated subsequent content block indicates no equivalence to one of the locally stored content blocks according to its respective client fingerprint.

2. The method of claim 1, further comprising:
for each of a second subset of the set of subsequent content blocks for each of which its corresponding server fingerprint indicates equivalence to one of the locally stored content blocks according to its respective client fingerprint, communicating a message from the server optimizer to the client optimizer indicating that there is an equivalent locally stored content blocks.

3. The method of claim 1, wherein the set of client fingerprints are associated with locally stored content blocks that were received and stored by the client optimizer sequentially after prior receipt of the matching content block.

4. The method of claim 1, wherein communicating the first fingerprint corresponding to the first content block from the server optimizer to the client optimizer comprises multicasting the first fingerprint from the server optimizer to a set of user terminals, one of the user terminals being associated with the client optimizer.

5. The method of claim 1, wherein determining, by the server optimizer, to communicate content data to the client optimizer comprises:
intercepting, by the server optimizer, a request communicated by the client optimizer for content from a content server;
determining to communicate the content data to the client optimizer when the content data is received at the server optimizer from the content server in response to the request.

6. The method of claim 1, wherein determining, by the server optimizer, to communicate content data to the client optimizer comprises:
receiving the content data at the server optimizer from a content source separate from the server optimizer along with an indication to deliver the content data to the client optimizer; and
determining to communicate the content data to the client optimizer according to the indication.

7. The method of claim 1, wherein determining, by the server optimizer, to communicate content data to the client optimizer comprises:
receiving the content data at the server optimizer; and
determining to communicate the content data to the client optimizer according to at least one of a client preference previously stored in association with the client optimizer; a client subscription stored in association with the client optimizer; a request history stored in association with the client optimizer; a client demographic stored in association with the client optimizer; or a popularity associated with the content data.

8. The method of claim 1, further comprising:
multicasting the first content block to the client optimizer and to at least one non-requesting user system.

9. The method of claim 1, wherein:
the response package further comprises a list of missing packets corresponding to the matching content block; and
communicating the subset of the set of subsequent content blocks from the server optimizer to the client optimizer comprises communicating content blocks from the server optimizer corresponding to the list of missing packets.

10. The method of claim 1, wherein:
the response package further comprises an indication of an amount of error loss incurred in relation to at least one of the locally stored content blocks; and
communicating the subset of the set of subsequent content blocks from the server optimizer to the client optimizer comprises communicating at least one of packets or error correction codes according to the indication.

11. The method of claim 1, further comprising:
determining whether the content is streaming media content, and, only when the content is streaming media content, performing the step of determining whether the corresponding server fingerprint indicates equivalence, and performing the step of communicating the subset of the set of subsequent content blocks.

12. The method of claim 1, wherein communicating the subset of the set of subsequent content blocks comprises multicasting the subset of the set of subsequent content blocks reliably to the client optimizer and opportunistically to at least one non-requesting user system.

13. The method of claim 1, wherein communicating the subset of the set of subsequent content blocks comprises communicating the subset of the set of subsequent content blocks according to a transport scheme that is reliable with respect to a communications link between the client optimizer and the server optimizer.

14. The method of claim 1, wherein communicating the subset of the set of subsequent content blocks comprises compressing the subset of the set of the number of subsequent content blocks into compressed content blocks, and communicating the compressed content blocks to the client optimizer.

15. The method of claim 1, wherein chunking the content data comprises deterministically chunking the content data into content blocks.

16. The method of claim 1, wherein computing fingerprints of the content blocks comprises computing checksums of the content blocks.

17. A server-side system, disposed in a communications network between client optimizers and content servers, for handling communication of content data from the content servers to the client optimizers over the communications network, the server-side system comprising: an object processing subsystem operable to: chunk content data into a first content block and a set of subsequent content blocks; and compute server fingerprints of each of the first content block and the set of subsequent content blocks; and a communications subsystem, in communication with the object processing subsystem, and operable to: communicate a first fingerprint corresponding to the first content block from the server optimizer to a client optimizer; receive a response package at the server optimizer from the client optimizer, the response package comprising a sequence of client fingerprints, wherein the response package is generated by the client optimizer only when the client optimizer determines that it is one of the first set of client optimizers in relation to the content data and in response to determining that a client fingerprint of the first locally stored content block matches the received first fingerprint, the first locally stored content block having been received and stored by the client optimizer prior to receiving the first server fingerprint from the server optimizer, the first locally stored content block being associated with the sequence of client fingerprints representing a set of next content blocks that were received and stored by the client optimizer directly after receipt of the first locally stored content block in sequence; determine, for each of the set of subsequent content blocks, whether the corresponding server fingerprint indicates equivalence to one of the locally stored content blocks according to its respective client fingerprint received as part of the response package; and communicate a subset of the set of subsequent content blocks from the server optimizer to the client optimizer, such that the corresponding server fingerprint of each communicated subsequent content block indicates no equivalence to one of the locally stored content blocks according to its respective client fingerprint.

18. The server-side system of claim 17, wherein the communications subsystem is operable to communicate the first fingerprint by multicasting the first fingerprint from the server optimizer to a set of user terminals, one of the user terminals being associated with the client optimizer.

19. The server-side system of claim 17, wherein:
the response package further comprises an indication of packet loss or error loss corresponding to the matching content block; and
the communications subsystem is operable to communicate the subset of the set of subsequent content blocks from the server optimizer to the client optimizer comprises communicating at least one of packets or error correction codes according to the indication.

20. The server-side system of claim 17, wherein communications subsystem is operable to communicate the subset of the set of subsequent content blocks by multicasting the subset of the set of subsequent content blocks reliably to the client optimizer and opportunistically to at least one non-requesting user system.

21. A system for opportunistically handling content data delivery from a server optimizer to a plurality of client optimizers over a communications network, the system comprising: a server optimizer operable to: select a first set of client optimizers of the plurality of client optimizers for reliable delivery of content data, the plurality of client optimizers in communication with the server optimizer over a shared communications link in such a way that, when the content data is reliably received by the first set of client optimizers over the shared communications link, others of the plurality of client optimizers opportunistically receive the content data over the shared communications link; multicast a set of fingerprints corresponding to the content data over the shared communications link; receive a response package at the server optimizer from each of the first set of client optimizers, each response package comprising a respective sequence of client fingerprints that indicates any portions of the content data presently stored local to the respective client optimizer, wherein the response package is generated by the respective client optimizer in response to the client optimizer only when the client optimizer determines that it is one of the first set of client optimizers in relation to the content data and in response to determining that a client fingerprint of a first locally stored content block at the respective client optimizer matches at least one of the received set of fingerprints, the first locally stored content block having been received and stored by the respective client optimizer prior to receiving the first server fingerprint from the server optimizer, the first locally stored content block being associated with the respective sequence of client fingerprints representing a set of next content blocks that were received and stored by the respective client optimizer directly after receipt of the first locally stored content block in sequence; determine a missing portion of the content data according to the portions of the content data not presently stored local to the first set of client optimizers as indicated by their respective response packages; and multicast the missing portion of the content data over the shared communications link according to the determination.

22. The system of claim 21, further comprising:
a plurality of client optimizers, each in communication with the server optimizer over the shared communications link, each operable to:
receive a fingerprint from the server optimizer corresponding to a portion of content data;
determine whether the corresponding portion of the content data matches locally stored content data according to the fingerprint;
generate the response package indicating any portions of the content data presently stored local to the client optimizer when the corresponding portion of the content data matches locally stored content data according to the fingerprint; and
store the corresponding portion of the content data when subsequently received by the client optimizer when the corresponding portion of the content data does not match locally stored content data according to the fingerprint.

23. The method of claim 21, wherein the server optimizer is further operable to:
determine a transport scheme that is reliable with respect to the first set of client optimizers,
wherein the set of fingerprints and the missing portion of the content data are multicast over the shared communications link according to the transport scheme.

24. A method for handling content communications between a server optimizer and a plurality of client optimizers over a communications network, the method comprising:
receiving, by a client optimizer from the server optimizer, a first server fingerprint corresponding to a first content block, the first content block being one of a plurality of content blocks generated by the server optimizer from content data;
determining, by the client optimizer, whether a first locally stored content block matches the first content block by comparing the first server fingerprint to a client fingerprint of the first locally stored content block, the first locally stored content block having been received and stored by the client optimizer prior to receiving the first server fingerprint from the server optimizer, the first locally stored content block being associated with a sequence of client fingerprints representing a set of next content blocks that were received and stored by the client optimizer directly after receipt of the first locally stored content block in sequence;
when the locally stored content block matches the first content block:
generating a response package by the client optimizer, the response package comprising the sequence of client fingerprints; and
communicating the response package from the client optimizer to the server optimizer in response to receiving the first server fingerprint;
receiving, in response to a request for the content data and in response to communicating the response package, either a second content block from the server optimizer or an indication that a second locally stored content block matches a second content block comprising a portion of the content data requested by the client optimizer from the content source; and
using content data of either the second content block or the second locally stored content block in fulfillment of a corresponding portion of the request for the content data.

25. The method of claim 24, further comprising:
when there is not a first locally stored content block that matches the first content block:
receiving and storing the first content block and a plurality of subsequent content blocks locally to the client optimizer;
storing, locally to the client optimizer, a client fingerprint corresponding to each of the first content block and the plurality of subsequent content blocks; and
tracking a received order of the first content block and the plurality of subsequent content blocks.

26. The method of claim 24, wherein the first content block and the plurality of subsequent content blocks are received opportunistically by the client optimizer.

27. The method of claim 24, wherein the response package is communicated from the client optimizer to the server optimizer at a response rate determined according to a link rate at which the client optimizer is consuming content blocks received from the server optimizer.

28. The method of claim 24, wherein the response package is communicated from the client optimizer to the server optimizer at a response rate determined according to an encoding rate at which an end user is consuming the content data.

29. A client-side system for receiving content data from content servers over a communications network via a server optimizer, the client-side system comprising:
an object processing subsystem operable to:
determine whether a first locally stored content block matches a first content block by comparing a first server fingerprint to a client fingerprint of the first locally stored content block, the first server fingerprint corresponding to a first content block being one of a plurality of content blocks generated by the server optimizer from content data, the first locally stored content block having been received and stored by the client optimizer prior to receiving the first server fingerprint from the server optimizer, and the first locally stored content block being associated with a sequence of client fingerprints representing a set of next content blocks that were received and stored by the client optimizer directly after receipt of the first locally stored content block in sequence; and
generate a response package by the client optimizer when the locally stored content block matches the first content block, the response package comprising the sequence of client fingerprints; and
a communications subsystem, in communication with the object processing subsystem, and operable to:
communicate the response package from the client optimizer to the server optimizer in response to receiving the first server fingerprint;
receive, in response to a request for the content data and in response to communicating the response package, either a second content block from the server optimizer or an indication that a second locally stored content block matches a second content block comprising a portion of the content data requested by the client optimizer from the content source; and use content data of either the second content block or the second locally stored content block in fulfillment of a corresponding portion of the request for the content data.

30. The client-side system of claim 29, further comprising:

a client dictionary, wherein the object processing subsystem is further operable, when there is not a first locally stored content block that matches the first content block, to:

receive the first content block and a plurality of subsequent content blocks;

generate a client fingerprint corresponding to each of the first content block and the plurality of subsequent content blocks;

store the client fingerprints in the client dictionary; and track a received order of the first content block and the plurality of subsequent content blocks.

* * * * *